(12) United States Patent
Song et al.

(10) Patent No.: US 10,672,789 B2
(45) Date of Patent: Jun. 2, 2020

(54) METHODS OF MANUFACTURING VERTICAL SEMICONDUCTOR DEVICES

(71) Applicant: Samsung Electronics Co., Ltd., Suwon-si (KR)

(72) Inventors: Min-Yeong Song, Seoul (KR); Chang-Seok Kang, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/120,364

(22) Filed: Sep. 3, 2018

(65) Prior Publication Data

US 2019/0148400 A1 May 16, 2019

(30) Foreign Application Priority Data

Nov. 10, 2017 (KR) .................. 10-2017-0149880

(51) Int. Cl.
*H01L 27/11565* (2017.01)
*H01L 27/11582* (2017.01)
(Continued)

(52) U.S. Cl.
CPC .... *H01L 27/11582* (2013.01); *H01L 21/0243* (2013.01); *H01L 21/0262* (2013.01); *H01L 21/02381* (2013.01); *H01L 21/02532* (2013.01); *H01L 21/02598* (2013.01); *H01L 21/02636* (2013.01); *H01L 21/02639* (2013.01);
(Continued)

(58) Field of Classification Search
CPC ......... H01L 27/11565; H01L 27/11582; H01L 27/1157
See application file for complete search history.

(56) References Cited

U.S. PATENT DOCUMENTS

| 8,169,016 B2 | 5/2012 | Higashi |
| 9,000,510 B2 | 4/2015 | Hong |

(Continued)

*Primary Examiner* — Grant S Withers
(74) *Attorney, Agent, or Firm* — Muir Patent Law, PLLC

(57) ABSTRACT

A vertical semiconductor device may include a first gate pattern, second gate patterns, a first channel hole, a first semiconductor pattern, a second channel hole, and a second semiconductor pattern. The first gate pattern may extend in a first direction on a substrate including first and second regions. The first direction may be parallel to an upper surface of the substrate, and a portion of the first gate pattern on the second region may include a first opening. The second gate patterns may be vertically stacked and spaced apart from each other on the first gate pattern, and each of the second gate patterns may extend in the first direction. The first channel hole may extend through the second gate patterns and the first gate pattern and expose a first portion of the substrate on the first region of the substrate. The first semiconductor pattern may be at a lower portion of the first channel hole. The second channel hole may extend through the second gate patterns and expose a second portion of the substrate on the second region of the substrate, and the second channel hole may be disposed within an area of the first opening in a plan view, wherein the first opening has a larger area than the second channel hole in a plan view. The second semiconductor pattern may be at a lower portion of the second channel hole.

20 Claims, 24 Drawing Sheets

(51) Int. Cl.
*H01L 29/10* (2006.01)
*H01L 29/423* (2006.01)
*H01L 27/1157* (2017.01)
*H01L 21/311* (2006.01)
*H01L 21/02* (2006.01)
*H01L 21/3065* (2006.01)
*H01L 21/768* (2006.01)
*H01L 27/11575* (2017.01)

(52) U.S. Cl.
CPC .... *H01L 21/3065* (2013.01); *H01L 21/31144* (2013.01); *H01L 21/76802* (2013.01); *H01L 27/1157* (2013.01); *H01L 27/11565* (2013.01); *H01L 27/11575* (2013.01); *H01L 29/1037* (2013.01); *H01L 29/4234* (2013.01)

(56) References Cited

U.S. PATENT DOCUMENTS

| | | |
|---|---|---|
| 9,153,705 B2 | 10/2015 | Zhang et al. |
| 9,306,041 B2 | 4/2016 | Hwang et al. |
| 9,564,451 B1 | 2/2017 | Shin et al. |
| 9,570,462 B2 | 2/2017 | Lee et al. |
| 2016/0268264 A1* | 9/2016 | Hwang ............. H01L 27/11578 |
| 2019/0080764 A1* | 3/2019 | Sugisaki ............ G11C 16/0483 |
| 2019/0181226 A1* | 6/2019 | Choi ................... H01L 29/1037 |

\* cited by examiner

METHODS OF MANUFACTURING VERTICAL SEMICONDUCTOR DEVICES

CROSS-REFERENCE TO RELATED APPLICATIONS

This application claims priority under 35 USC § 119 to Korean Patent Application No. 10-2017-0149880, filed on Nov. 10, 2017 in the Korean Intellectual Property Office (KIPO), the contents of which are herein incorporated by reference in their entirety.

BACKGROUND

1. Field

The present disclosure relates to methods of manufacturing vertical semiconductor devices. More particularly, the present disclosure relates to methods of manufacturing vertical NAND flash memory devices.

2. Description of the Related Art

Recently, a vertical semiconductor device having a plurality of memory cells vertically stacked has been developed. As the memory cells are vertically stacked at a plurality of levels, respectively, each of the memory cells at each level may not have good electrical characteristics.

SUMMARY

Example embodiments provide a vertical semiconductor device having improved characteristics.

According to one embodiment, a vertical semiconductor device includes a first gate pattern, second gate patterns, a first channel hole, a first semiconductor pattern, a second channel hole, and a second semiconductor pattern. The first gate pattern may extend in a first direction on a substrate including first and second regions. The first direction may be parallel to an upper surface of the substrate, and a portion of the first gate pattern on the second region may include a first opening. The second gate patterns may be vertically stacked and spaced apart from each other on the first gate pattern, and each of the second gate patterns may extend in the first direction. The first channel hole may extend through the second gate patterns and the first gate pattern and expose a first portion of the substrate on the first region of the substrate. The first semiconductor pattern may be at a lower portion of the first channel hole. The second channel hole may extend through the second gate patterns and expose a second portion of the substrate on the second region of the substrate, and the second channel hole may be disposed within an area of the first opening in a plan view, wherein the first opening has a larger area than the second channel hole in a plan view. The second semiconductor pattern may be at a lower portion of the second channel hole.

According to one embodiment, a vertical semiconductor device includes a conductive pattern structure, a first channel hole, a first semiconductor pattern, a second channel hole, and a second semiconductor pattern. The conductive pattern structure may include a first gate pattern and second gate patterns on each of first and second regions of a substrate, and the first gate pattern and second gate patterns may be sequentially stacked in a vertical direction perpendicular to an upper surface of the substrate. The first channel hole extends through the second gate patterns and the first gate pattern and exposes a first portion of the substrate on the first region of the substrate. The first semiconductor pattern may be at a lower portion of the first channel hole, and the first semiconductor pattern may contact the first gate pattern. The second channel hole extends through the second gate patterns and exposes a second portion of the substrate on the second region of the substrate. The second semiconductor pattern may be at a lower portion of the second channel hole, and the second semiconductor pattern may not contact the first gate pattern.

According to one embodiment, a vertical semiconductor device includes a first gate pattern, second gate patterns, a first vertical structure, and a second vertical structure. The first gate pattern may extend in a first direction on a substrate including first and second regions, and the first direction may be parallel to an upper surface of the substrate. The portion of the first gate pattern on the first region may include a first opening. The second gate patterns may be vertically stacked and spaced apart from each other on the first gate pattern, and each of the second gate patterns may extend in the first direction. The first vertical structure may include a first semiconductor pattern and may extend through the second gate patterns and the first gate pattern and contacting a first portion of the substrate on the first region of the substrate, and the first semiconductor pattern may contact the first gate pattern. The second vertical structure may include a second semiconductor pattern and may extend through the second gate patterns and the first gate pattern and may contact a portion of the substrate on the second region of the substrate, and the second semiconductor pattern may not contact the first gate pattern.

In the vertical semiconductor device in accordance with example embodiments, the first gate on the second region of the substrate may include an opening, and a second channel structure may be disposed within an area of the first opening in a plan view. Thus, the second channel structure may not contact the first gate pattern. Accordingly, the vertical semiconductor device may not have leakage current or deteriorated reliability due to the semiconductor pattern of the second channel structure and the first gate pattern.

DETAILED DESCRIPTION

The above and other aspects and features of the vertical memory devices and the methods of manufacturing the same in accordance with example embodiments will become readily understood from detail descriptions that follow, with reference to the accompanying drawings.

Figure 1:
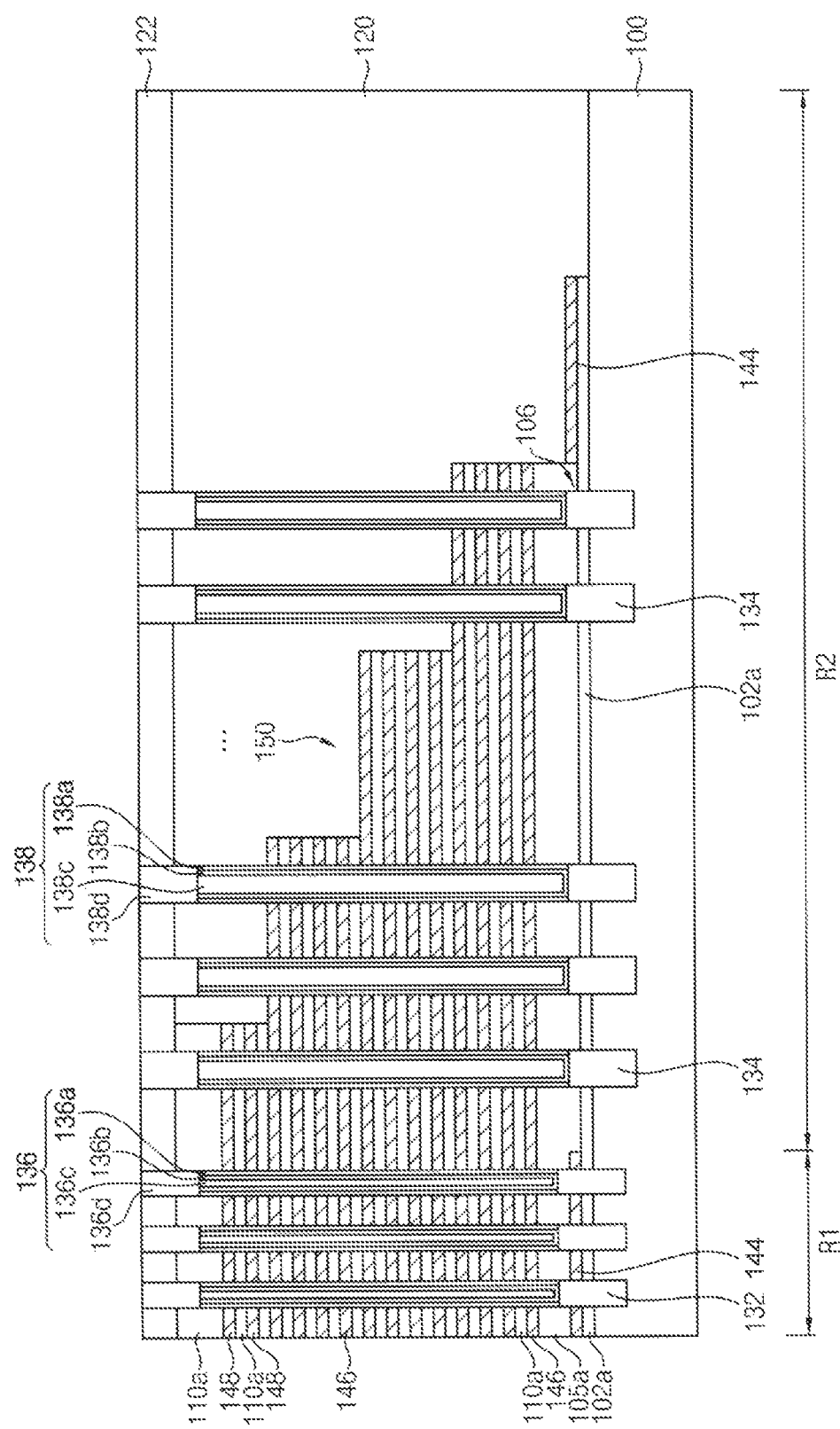
FIGS. 1 and 2 are a cross-sectional view and a plan view, respectively, illustrating a vertical semiconductor device in accordance with example embodiments.
Figure 2:
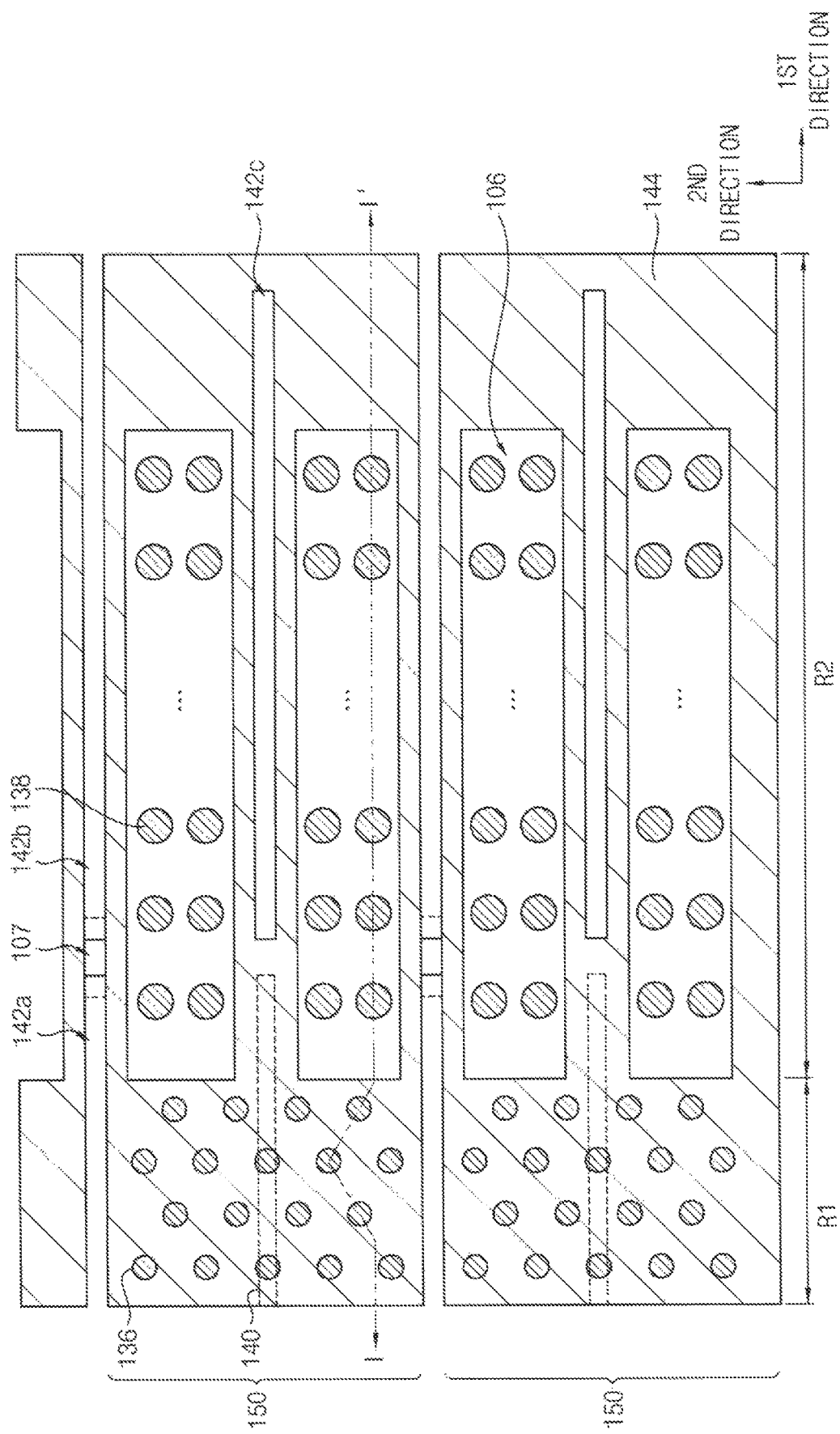
Figure 3:
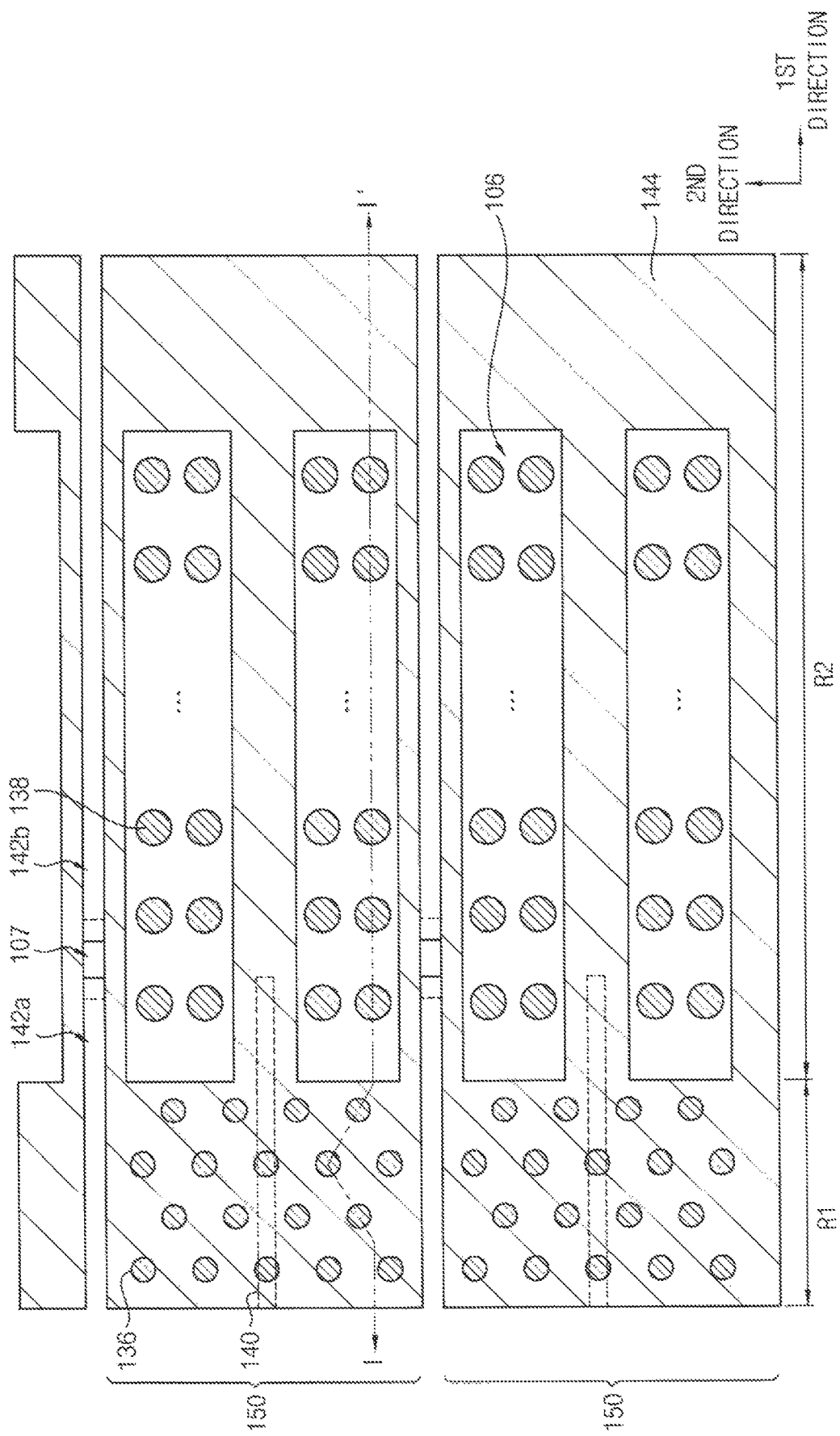
FIG. 3 is a plan view illustrating a vertical semiconductor device in accordance with example embodiments.

FIGS. 1 and 2 are a cross-sectional view and a plan view, respectively, illustrating a vertical semiconductor device in accordance with example embodiments. FIG. 3 is a plan view illustrating a vertical semiconductor device in accordance with example embodiments.

FIGS. 2 and 3 show ground selection lines (GSLs) and first and second channel structures.

Referring to FIGS. 1 and 2, a substrate 100 may include first and second regions R1 and R2. The first region R1 may be a region for memory cells, and the second region R2 may be a region for wirings electrically connected to the memory cells. Though not shown, the second region R2 may surround the first region R1, and may contact an edge of the first region R1.

A conductive pattern structure 150, a first channel structure 136, and a second channel structure 138 may be formed on the first and second regions R1 and R2. For example, the conductive pattern structure 150 may be formed on both first and second regions R1 and R2, the first channel structure 136 may be formed on first region R1, and the second channel structure 138 may be formed on the second region R2.

The substrate 100 may include a semiconductor material, e.g., silicon, germanium, silicon-germanium, etc.

Hereinafter, the conductive pattern structure 150 on the first and second regions R1 and R2 will be illustrated.

The conductive pattern structure 150 may have a stacked structure including insulation layers 102*a*, 105*a* and 110*a* and gate patterns 144, 146 and 148 alternately stacked. The gate patterns 144, 146 and 148 may be spaced apart from each other in a third direction perpendicular to an upper surface of the substrate 100. The conductive pattern structure 150 may extend in a first direction parallel to the upper surface of the substrate 100. Each of the conductive pattern structures 150 may serve as a cell block. Terms such as "same," "equal," "planar," "coplanar," "perpendicular," and "parallel" as used herein when referring to orientation, layout, location, shapes, sizes, amounts, or other measures do not necessarily mean an exactly identical or an exact orientation, layout, location, shape, size, amount, or other measure, but are intended to also encompass nearly identical or nearly exact orientation, layout, location, shapes, sizes, amounts, or other measures within acceptable variations that may occur, for example, due to manufacturing processes. The term "substantially" may be used herein to emphasize this meaning, unless the context or other statements indicate otherwise.

The gate patterns 144, 146 and 148 of the conductive pattern structure 150 may include a GSL, a string selection line (SSL), and word lines between the GSL and the SSL. In example embodiments, a lowermost one of the gate patterns 144, 146 and 148, i.e., the gate pattern 144 may serve as the GSL, and uppermost two of the gate patterns 144, 146 and 148, i.e., the gate patterns 146 may serve as the SSLs, respectively.

The gate patterns 144, 146 and 148 may include a metal. In example embodiments, each of the gate patterns 144, 146 and 148 includes a metal pattern and a barrier pattern. The metal pattern may include, e.g., tungsten, copper, cobalt, aluminum, etc., and the barrier pattern may include, e.g., titanium, titanium nitride, tantalum, tantalum nitride, etc.

A portion of the conductive pattern structure 150 on the second region R2 may have a staircase shape. In example embodiments, the gate patterns 144, 146 and 148 have steps each of which may extend in each of first and second directions parallel to the upper surface of the substrate 100 and perpendicular to each other. Upper surfaces of the steps of the gate patterns 144, 146 and 148 not covered by overlying ones of the gate patterns 144, 146 and 148 may serve as pads for contacting contact plugs, which may be referred to as a gate pad hereinafter.

First and second insulating interlayers 120 and 122 may cover the conductive structure 150. The first insulating interlayer 120 may cover the staircase-shaped portion of the conductive pattern structure 150, and the second insulating interlayer 122 may be formed on the conductive pattern structure 150 and the first insulating interlayer 120. An upper surface of the second insulating interlayer 122 may be substantially flat.

Third and fourth openings 142*a* and 142*b* exposing upper surfaces of the substrate 100 may be disposed between the conductive pattern structures 150. The conductive pattern structures 150 serving as cell blocks, respectively, may be divided from each other by the third and fourth openings 142*a* and 142*b*.

The third opening 142*a* may extend in the first direction from the first region R1 to a portion of the second region R2. The fourth opening 142*b* may be disposed on the second region R2. The fourth opening 142*b* may be spaced apart from the third opening 142*a* in the first direction, and may be arranged in the same line with the third opening 142*a*. Thus, the word lines 146 at each level may be connected with each other at an area between third and fourth openings 142*a* and 142*b*, and the SSLs 148 at each level may be also connected with each other at the area between third and fourth openings 142*a* and 142*b*.

The GSL 144 of each of the conductive pattern structures 150 on the second region R2 may have two first openings 106 that may extend in the first direction and may be parallel to each other. The GSL 144 of each of the conductive pattern structures 150 on the second region R2 may have a first hole 107 that may be disposed between the third and fourth openings 142*a* and 142*b* in the first direction in a plan view. Although the terms first, second, third, etc. may be used herein to describe various holes, openings, regions, layers, or other components or elements, these holes, openings, regions, layers, or other components or elements should not be limited by these terms. Unless the context indicates otherwise, these terms are only used to distinguish one hole, opening, region, layer, or other component or element from another, for example as a naming convention. Thus, the naming terms may be used for different holes, openings, regions, layers, or other components or elements in the claims than used to describe theses holes, openings, regions, layers, or other components or elements in the specification, and such usage is still consistent with the teachings of the specification.

In example embodiments, the first opening 106 may be disposed between the fourth openings 142*b* in the second direction in a plan view. Thus, the GSL 144 may have the first opening 106 therein, and may extend in the first direction at each of opposite sides of the first opening 106 in the second direction. For example, the GSL 144 may include two first openings 106 extending in the first direction. Each first opening 106 may not extend to an end of the second region R2 in the first direction. Thus, the GSL 144 may not be divided into two pieces by either first opening 106, and a portion of the GSL 144 may exist around an end of each first opening 106 in the first direction.

The first hole 107, the third opening 142*a*, and the fourth opening 142*b* may be connected with one another to extend in the first direction, and the GSLs 144 may be spaced apart from each other by the connected first hole 107, the third opening 142a, and the fourth opening 142b, which collectively may be referred to as gate separation openings.

A second opening 140 may be formed between the SSLs 148 of each conductive pattern structure 150. The second opening 140 may extend in the first direction from the first region R1 to a portion of the second region R2. In one embodiment, the second opening 140 may extend through upper two gate patterns 148.

In example embodiments, as shown in FIG. 2, a fifth opening 142c spaced apart from the second opening 140 in the first direction may extend through the conductive pattern structure 150. The fifth opening 142c may be formed in line with the second opening 140. The fifth opening 142c may expose an upper surface of the substrate 100. The fifth opening 142c may not extend to an edge of the second region R2 in the first direction. The fifth opening 142c may be disposed between the first openings 106. For example, for each gate pattern 144 formed between adjacent gate separation openings (e.g., for each gate line), a fifth opening 142c may be disposed between two adjacent first openings 106.

In some embodiments, as shown in FIG. 3, no fifth opening may be disposed in each conductive pattern structure 150 on the second region R2.

The first channel structure 136 may extend through the conductive pattern structure 150 on the first region R1. The second channel structure 138 may extend through the conductive pattern structure 150 on the second region R2. The second channel structure 138 may be disposed within an area of the first opening 106 in a plan view. Though only one first channel structure 136 and second channel structure 138 are labeled, each conductive pattern structure 150 includes a plurality of first channel structures 136 and second channel structures 138, that may include the same features as those labeled and discussed in this disclosure.

A first semiconductor pattern 132 may be disposed under the first channel structure 136 and contact the substrate 100, a second semiconductor pattern 134 may be disposed under the second channel structure 138 and contact the substrate 100. The first and second semiconductor patterns 132 and 134 may include, e.g., single crystalline silicon. The first semiconductor pattern 132 combined with the first channel structure 136 may be described generally herein as a structure (e.g., first structure), or as a vertical structure, or vertical channel structure. Similarly, the second semiconductor pattern 134 combined with the second channel structure 138 may be described generally herein as a structure (e.g., second structure), or as a vertical structure, or vertical channel structure.

A sidewall of the first semiconductor pattern 132 may contact the GSL 144, while a sidewall of the second semiconductor pattern 134 may not contact the GSL 144 (e.g., it may be formed in one of the first openings 106). The sidewall of the second semiconductor pattern 134 may contact a lowermost one of the insulation layers 102a, 105a and 110a under the word line 146, i.e., the insulation layer 102a. In some embodiments, the sidewall of the second semiconductor pattern 134 may also contact the insulation layer 105a.

The first channel structure 136 may include a first dielectric layer structure 136a, a first channel 136b, a first filling insulation pattern 136c, and a first pad pattern 136d. The second channel structure 138 may include a second dielectric layer structure 138a, a second channel 138b, a second filling insulation pattern 138c, and a second pad pattern 138d. The first and second channel structures 136 and 138 may have substantially the same stacked structure, in terms of positions and orientations of the different patterns and structures, and may have the same or different sizes, as discussed further below.

Each of the first and second channels 136b and 138b may have a cylindrical shape or a cup-like shape. The first and second channels 136b and 138b may include polysilicon or single crystalline silicon. The first and second filling insulation patterns 136c and 138c may fill inner spaces of the first and second channels 136b and 138b, respectively. The first and second filling insulation patterns 136c and 138c may include an insulating material, e.g., silicon oxide. In an example embodiment, each of the first and second channels 136b and 138b may have a pillar shape, and in this case, no filling insulation patterns may be formed. The first and second dielectric layer structures 136a and 138a may surround outer sidewalls of the first and second channels 136b and 138b, respectively. Each of the first and second dielectric layer structures 136a and 138a may include a tunnel insulation layer, a charge storage layer, and a blocking layer sequentially stacked from the outer sidewall of the first and second channels 136b and 138b, respectively. The blocking layer may include silicon oxide, or a metal oxide, e.g., hafnium oxide or aluminum oxide. The charge storage layer may include a nitride, e.g., silicon nitride, or a metal oxide. The tunnel insulation layer may include an oxide, e.g., silicon oxide. The first pad pattern 136d may be disposed on the first dielectric layer structure 136a, the first channel 136b, and the first filling insulation pattern 136c, and the second pad pattern 138d may be disposed on the second dielectric layer structure 138a, the second channel 138b, and the second filling insulation pattern 138c.

The first and second channel structures 136 and 138 may have substantially the same width as each other or different widths from each other, in a horizontal direction (e.g., from a plan view). In example embodiments, a width of the second channel structure 138 may be greater than a width of the first channel structure 136 in the horizontal direction (e.g., from a plan view). Therefore, in some embodiments, widths of the second pad patterns 138d are greater than widths of the first pad patterns 136d in the horizontal direction, and widths of the second filling insulation patterns 138c are greater than widths of the first filling insulation patterns 136c in the horizontal direction. Also, as can be seen from FIGS. 2 and 3, an area of each first opening 106 is greater than an area of each second channel structure 138 in the second region R2 in a plan view, and in some embodiments, is greater than the area of a plurality of second channel structures 138 in the second region R2.

The first semiconductor pattern 132 may serve as a channel region of the GSL 144. Thus, an upper surface of the first semiconductor pattern 132 may be higher than that of the GSL 144 and lower than a bottom surface of a lowermost one of the word lines 146.

An upper surface (e.g., uppermost surface) of the second semiconductor pattern 134 may be lower than the bottom surface of a lowermost one of the word lines 146.

In example embodiments, the upper surface (e.g., uppermost surface) of the second semiconductor pattern 134 may be coplanar with or lower than the upper surface (e.g., uppermost surface) of the first semiconductor pattern 132. For example, when the width of the second channel structure 138 is greater than that of the first channel structure 136 and a bottom surface of the second channel structure 138 is lower than that of the first channel structure 136, the upper surface of the second semiconductor pattern 134 may be lower than that of the first semiconductor pattern 132.

An upper insulating interlayer (not shown) may be further formed on the second insulating interlayer 122. A contact plug (not shown) may extend through the upper insulating interlayer and the first and second insulating interlayers 120 and 122 to contact the gate pad of the staircase-shaped portion of the conductive pattern structure 150 (e.g., in the second region R2). In example embodiments, the contact plug may include a metal pattern and a barrier pattern. A wiring may be further formed on the contact plug.

FIGS. 4 to 18 are cross-sectional views and plan views illustrating a method of manufacturing a vertical semiconductor device in accordance with example embodiments.

Particularly, FIGS. 4-5, 7-8, 10-11, and 13-14 are cross-sectional views, and FIGS. 6, 9, 12, 15-16, and 17 are plan views.

Figure 4:
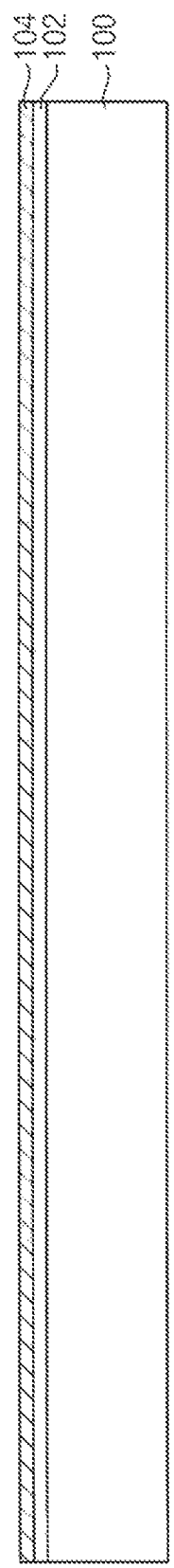
FIGS. 4 to 18 are cross-sectional views and plan views illustrating a method of manufacturing a vertical semiconductor device in accordance with example embodiments.

Referring to FIG. 4, a preliminary first lower insulation layer 102 and a first sacrificial layer 104 may be sequentially formed on a substrate 100 including first and second regions R1 and R2.

The preliminary first lower insulation layer 102 may include an oxide, e.g., silicon oxide. The first sacrificial layer 104 may include a material having an etching selectivity with respect to the preliminary first lower insulation layer 102, e.g., silicon nitride. The first sacrificial layer 104 may be formed in order to form a GSL subsequently.

Figure 5:
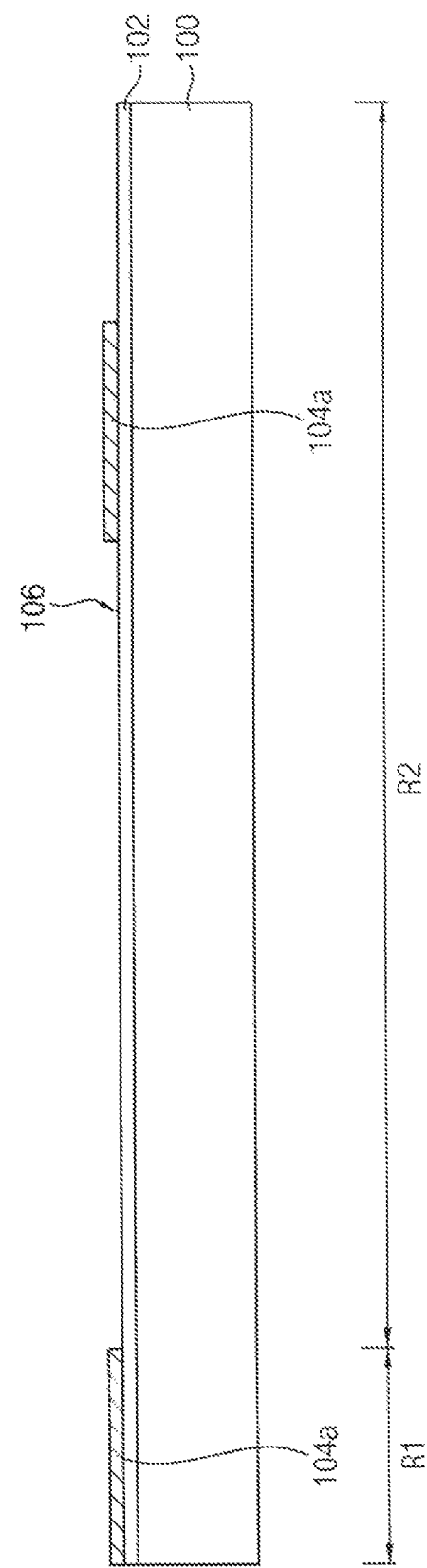
Figure 6:
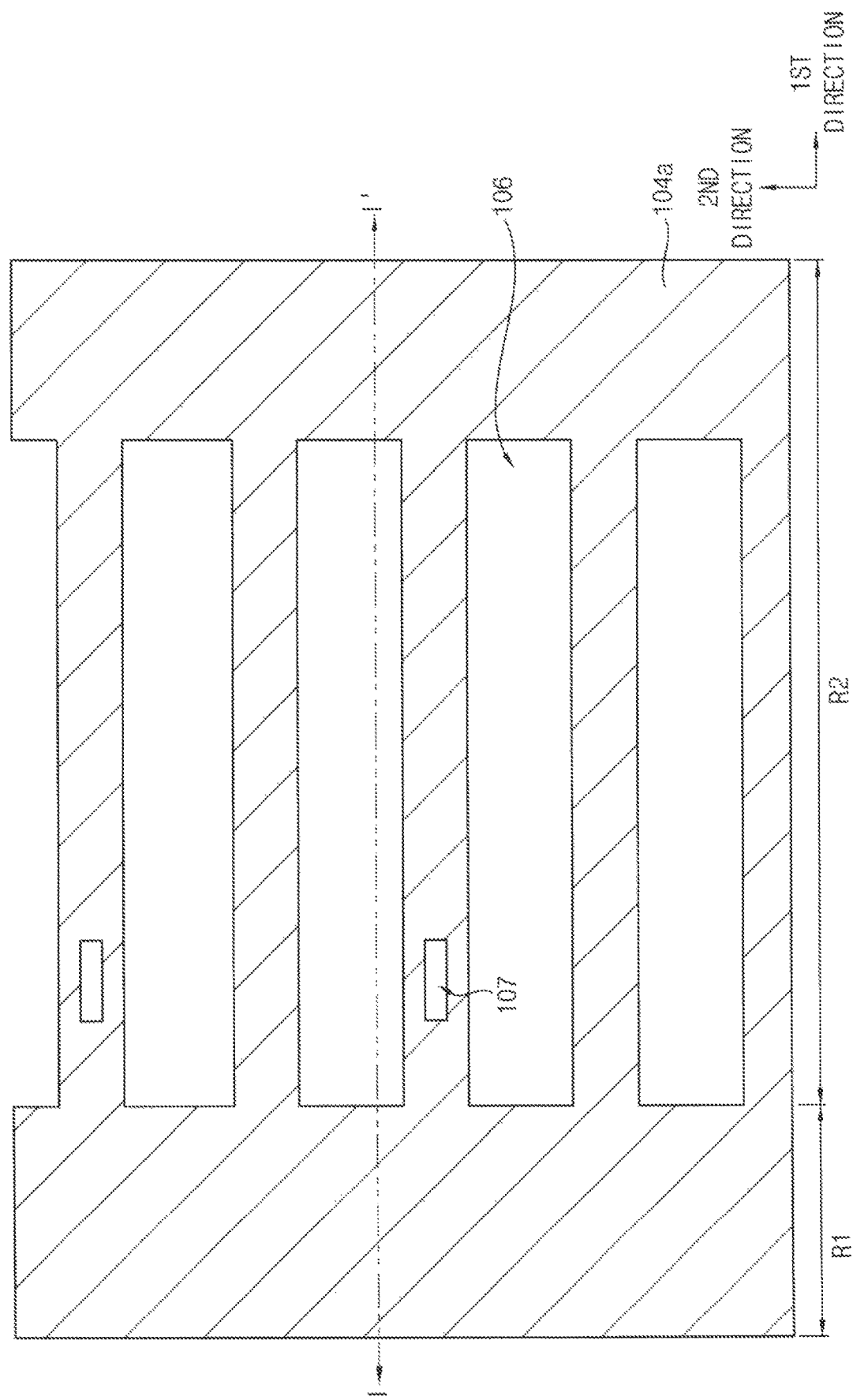

Referring to FIGS. 5 and 6, an etching mask may be formed on the first sacrificial layer 104, and the first sacrificial layer 104 may be etched using the etching mask to form a preliminary first sacrificial layer pattern 104a.

By the etching process, a first hole 107 and a first opening 106 may be formed in portions of the first sacrificial layer 104 on the second region R2. However, a portion of the first sacrificial layer 104 on the first region R1 may not be etched. The first opening 106 may be simultaneously formed with the first hole 107.

The first hole 107 may be used for dividing the GSL when a word line cutting process is subsequently performed. One first hole 107 may be formed at a boundary area between cell blocks.

In the word line cutting process, sacrificial layers may be partially removed along the first direction so that word lines may be formed to define cell blocks. In the word line cutting process, a portion of the sacrificial layers at each level on the second region R2 may not be removed, so that the sacrificial layers at each level may be connected with each other. Thus, when the sacrificial layers are replaced with word lines, the word lines at each level may be electrically connected with each other.

The first hole 107 may vertically overlap the portion of the sacrificial layers not removed in the word line cutting process. An end of the first hole 107 may partially overlap a portion of the sacrificial layers removed in the word line cutting process.

The first opening 106 may extend in the first direction on the second region R2. The first opening 106 may not extend to an end of the preliminary first sacrificial layer pattern 104a in the first direction.

The first opening 106 may be disposed in an area at which the GSL will be formed. The first opening 106 may be disposed between portions of the sacrificial layers removed in the word line cutting process in the second direction. In example embodiments, two first openings 106 may be formed in each one cell block.

In example embodiments, a first end of the first opening 106 far from the first region R1 may not be arranged with ends of the sacrificial layers removed in the word line cutting process along the second direction. A distance between the first end of the first opening 106 and the first region R1 may be less than a distance between the ends of the sacrificial layers removed in the word line cutting process and the first region R1.

As shown in FIG. 6, a portion of the preliminary first sacrificial layer pattern 104a between the first openings 106 may extend in the first direction. In example embodiments, the first hole 107 may be disposed in one of two portions of the preliminary first sacrificial layer pattern 104a extending in the first direction between the first openings 106.

In example embodiments, a width in the second direction of the portion of the preliminary first sacrificial layer pattern 104a extending in the first direction between the first openings 106 may be greater than that of the portions of the sacrificial layers removed in the word line cutting process.

Figure 7:
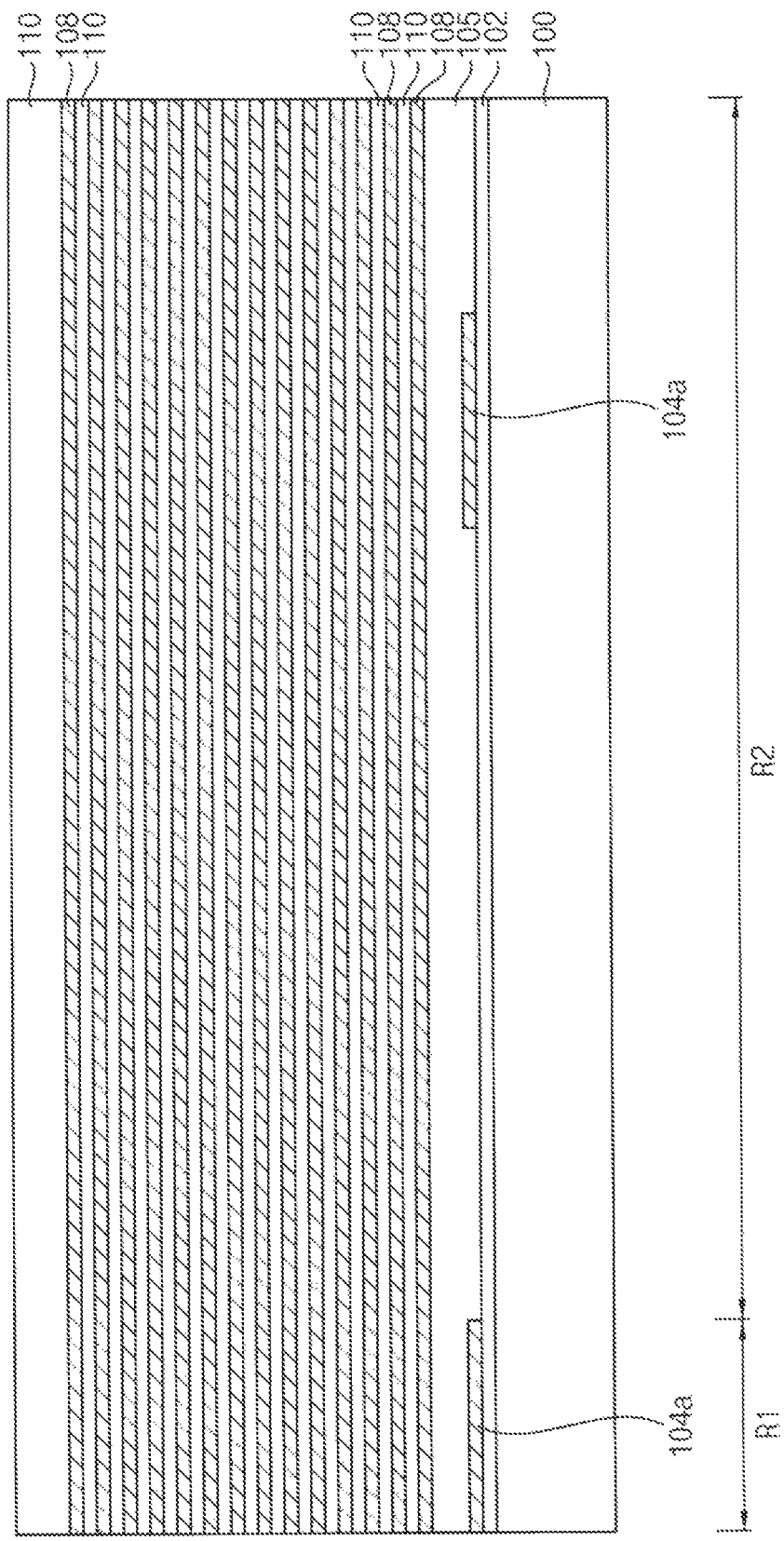

Referring to FIG. 7, a preliminary second lower insulation layer 105 may be formed on the preliminary first sacrificial layer pattern 104a and the preliminary first lower insulation layer 102.

A preliminary second sacrificial layer 108 and a preliminary first insulation layer 110 may be alternately and repeatedly formed on the preliminary second lower insulation layer 105. The number of stacked layers of the preliminary second sacrificial layer 108 and the preliminary first insulation layer 110 may not be limited to the amount shown in FIG. 7.

In example embodiments, the preliminary second lower insulation layer 105 may be formed by forming an insulation layer on the preliminary first sacrificial layer pattern 104a and the preliminary first lower insulation layer 102, and an upper portion of the insulation layer may be planarized. Thus, the preliminary second lower insulation layer 105 may have a flat upper surface. The preliminary second lower insulation layer 105 may fill the first opening 106 and the first hole 107. In one embodiment, the preliminary second lower insulation layer 105 may include a material substantially the same as that of the preliminary first lower insulation layer 102, e.g., silicon oxide.

The preliminary second sacrificial layer 108 may include a material substantially the same as that of the preliminary first sacrificial layer pattern 104a, e.g., silicon nitride. The preliminary first insulation layer 110 may include a material substantially the same as that of the preliminary first and second lower insulation layers 102 and 105, e.g., silicon oxide. The preliminary second sacrificial layer 108 may provide a space for word lines and SSLs.

In example embodiments, a thickness of the preliminary second lower insulation layer 105 may be greater than that of the preliminary first insulation layer 110. A thickness of an uppermost one of the preliminary first insulation layers 110 may be greater than those of other ones of the preliminary first insulation layers 110 thereunder.

Figure 8:
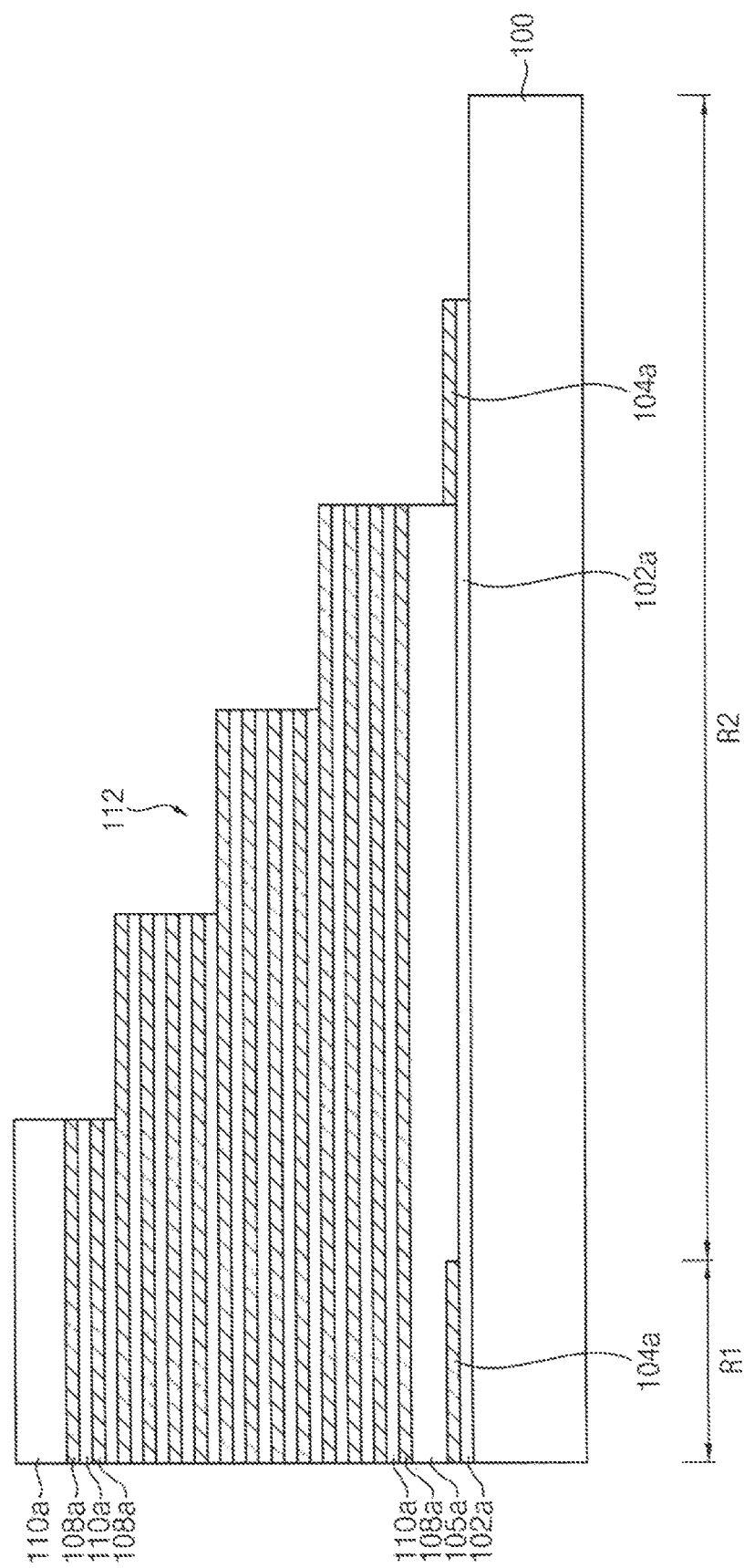
Figure 9:
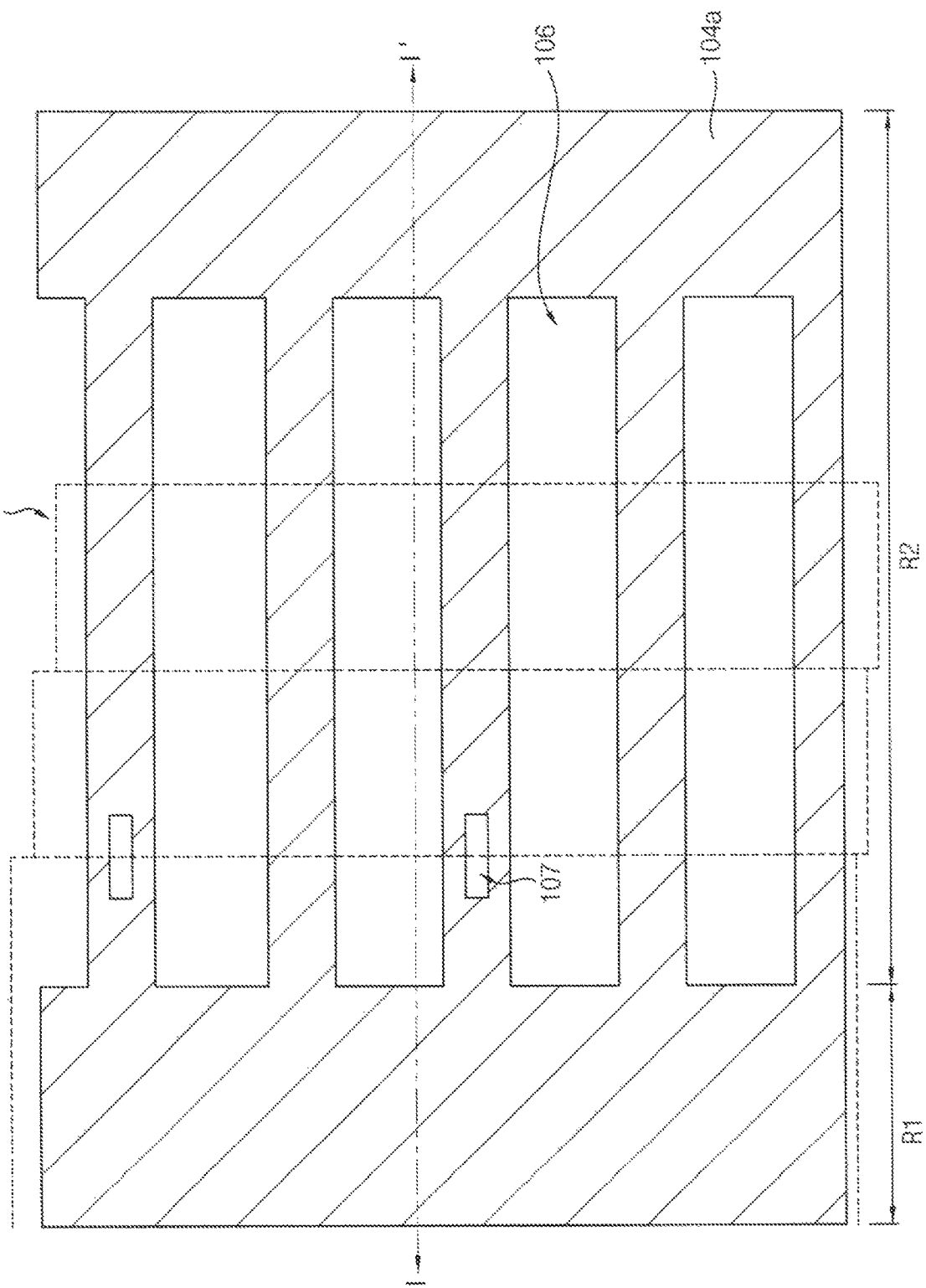

Referring to FIGS. 8 and 9, the preliminary first insulation layers 110, the preliminary second sacrificial layers 108, the preliminary second lower insulation layer 105, the preliminary first sacrificial layer pattern 104a, and the preliminary first lower insulation layer 102 on the second region R2 may be etched to form a preliminary staircase-shaped mold structure 112. The preliminary staircase-shaped mold structure 112 may include first insulation layers 110a, second sacrificial layers 108a, a second lower insulation layer 105a, a preliminary first sacrificial layer pattern 104a, and a first lower insulation layer 102a.

The preliminary staircase-shaped mold structure 112 may include steps along each of the first and second directions on the second region R2. For example, one step of the preliminary staircase-shaped mold structure 112 may include four second sacrificial layers 108a stacked at four levels, respectively. The stack number of the second sacrificial layers 108a may not be limited as such.

The preliminary first sacrificial layer pattern 104a and the second sacrificial layers 108a may be removed in a subsequent process to provide a space for gate patterns. The gate patterns may include a GSL, word lines, and an SSL. In example embodiments, the preliminary first sacrificial layer pattern 104a may be replaced with the GSL, at least one uppermost one of the second sacrificial layers 108a may be replaced with the SSL. Others of the second sacrificial layers 108a may be replaced with the word lines. In some embodiments, the preliminary first sacrificial layer pattern 104a may be formed at a plurality of levels, and in this case, a plurality of GSLs may be formed at a plurality of levels, respectively.

Hereinafter, a string including one GSL, two SSLs, and a plurality of word lines will be illustrated, however, the inventive concepts are not limited thereto.

As shown in FIG. 9, in one embodiment, only the preliminary first sacrificial pattern 104a includes the first hole 107 and the first opening 106 therethrough. In this embodiment, the second sacrificial layers 108a on the preliminary first sacrificial layer pattern 104a include neither the first hole 107 nor the first opening 106.

Figure 10:
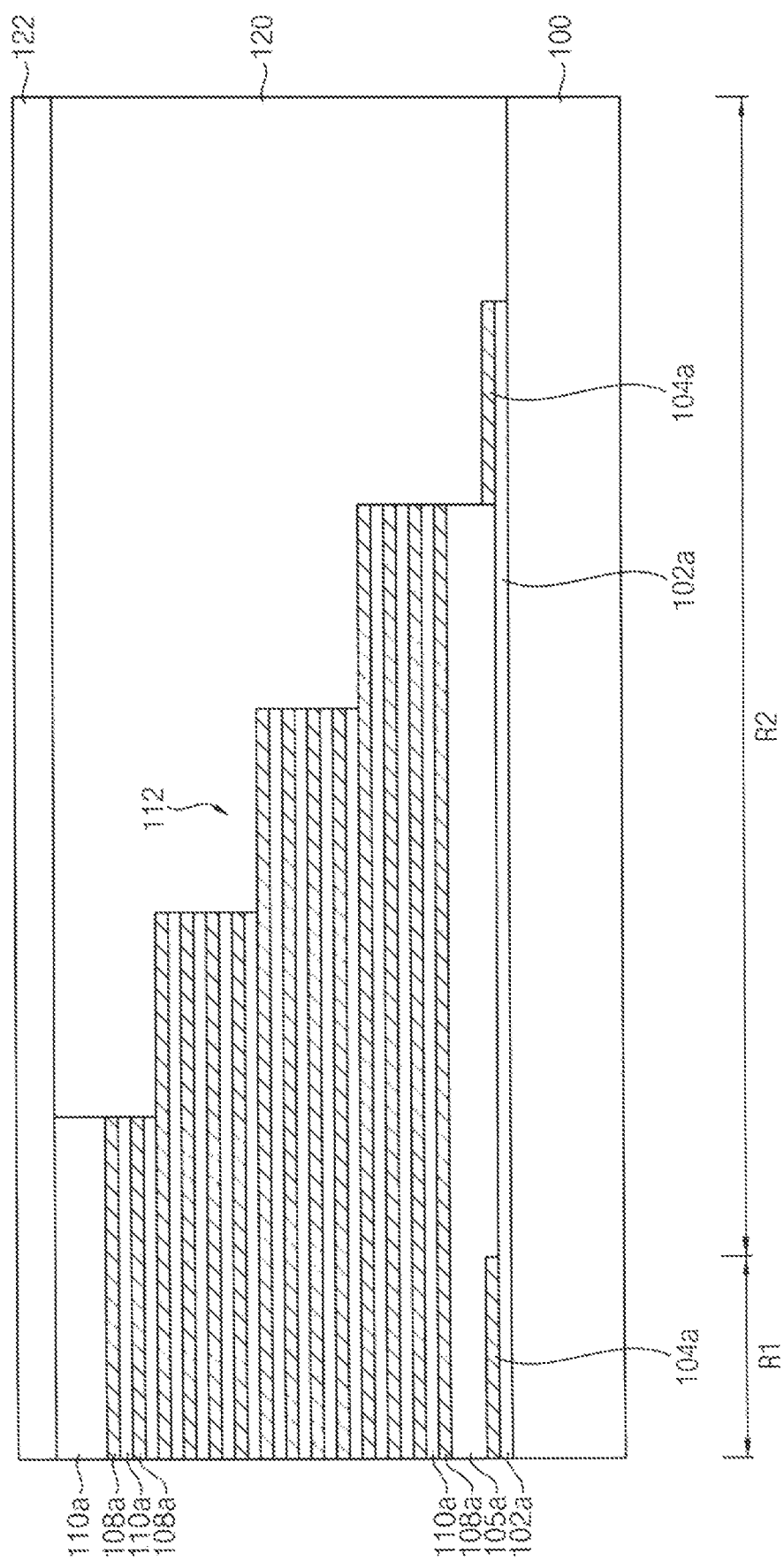

Referring to FIG. 10, a first insulating interlayer 120 is formed to cover sidewalls of the preliminary staircase-shaped mold structure 112. A second insulating interlayer 122 is formed on the first insulating interlayer 120 and the preliminary staircase-shaped mold structure 112.

Particularly, the first insulating interlayer 120 may be formed to cover the preliminary staircase-shaped mold structure 112, and an upper portion of the first insulating interlayer 120 may be planarized. In example embodiments, an upper surface of the first insulating interlayer 120 may be coplanar with an upper surface of the preliminary staircase-shaped mold structure 112. The second insulating interlayer 122 may be formed on the first insulating interlayer 120 and the preliminary staircase-shaped mold structure 112. Thus, the second insulating interlayer 122 may have a flat upper surface.

The first and second insulating interlayers 120 and 122 may include an insulating material, e.g., silicon oxide.

Figure 11:
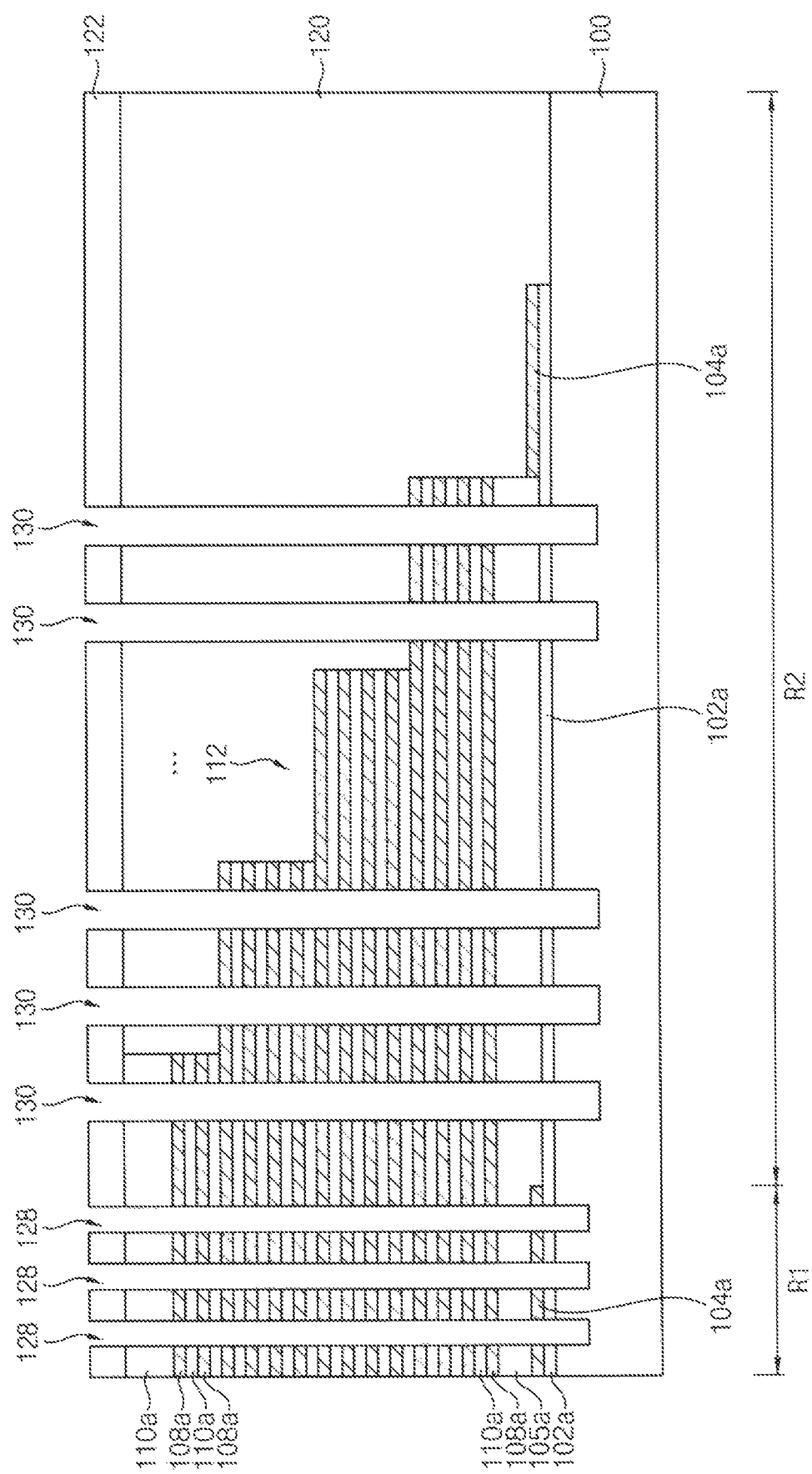
Figure 12:
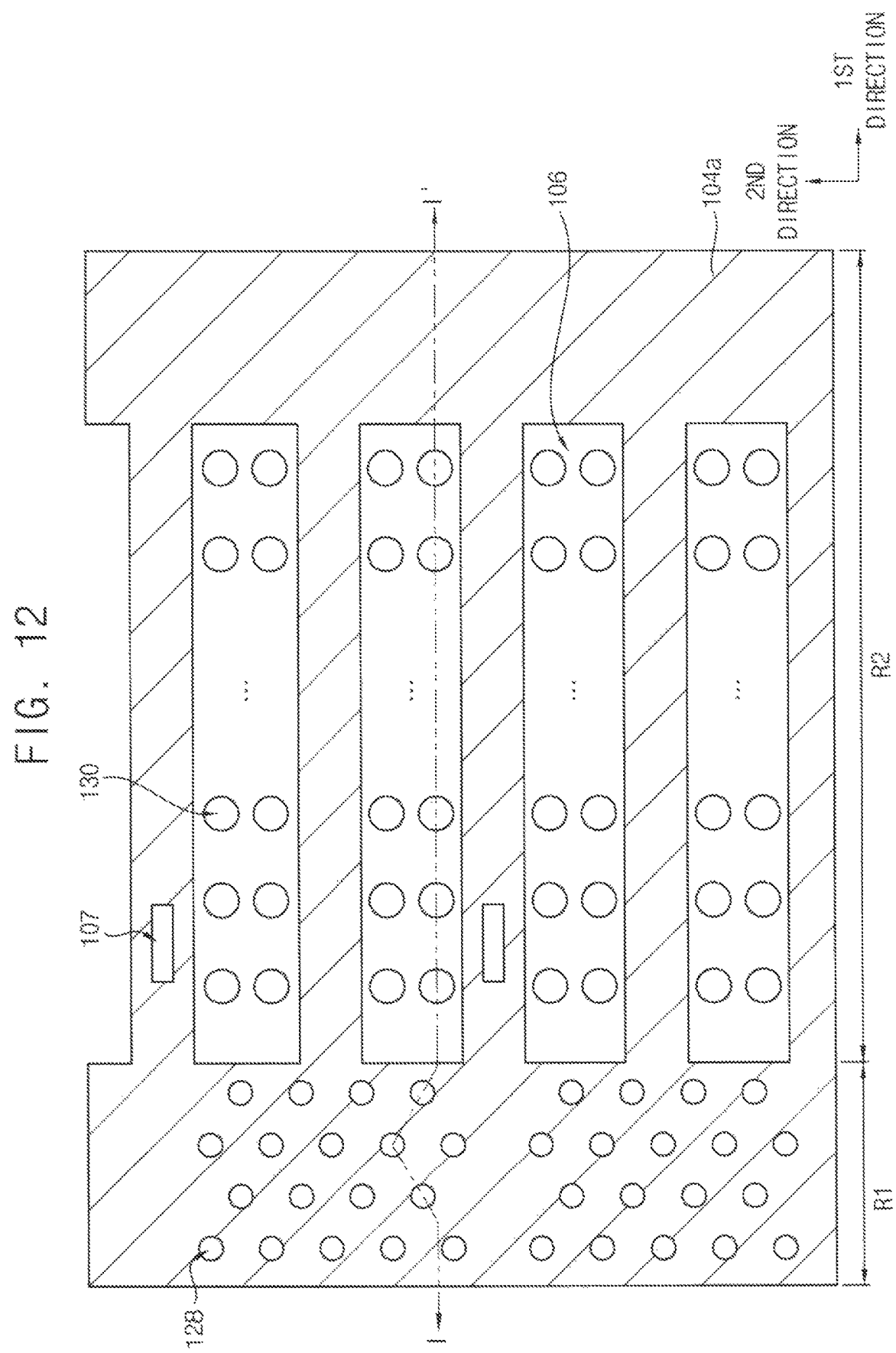

Referring to FIGS. 11 and 12, the preliminary staircase-shaped mold structure 112 and the first and second insulating interlayers 120 and 122 may be anisotropically etched to form first and second channel holes 128 and 130 exposing upper surfaces of the substrate 100. The first channel holes 128 may be formed on the first region R1, and the second channel holes 130 may be formed on the second region R2, thereby exposing different portions of the substrate 100 in the different regions. A first channel structure will be subsequently formed in each of the first channel holes 128, and a second channel structure will be subsequently formed in each of the second channel holes 130. The second channel structure may not serve as an active channel but may serve as a supporter for supporting a mold structure in a subsequent process.

As shown in FIG. 12, in one embodiment, the second channel holes 130 overlap the first opening 106 of the preliminary first sacrificial layer pattern 104a. Thus, the second channel holes 130 do not extend through the preliminary first sacrificial layer pattern 104a. Thus, the second channel holes 130 do not expose the preliminary first sacrificial layer pattern 104a.

However, in this embodiment, the second channel holes 130 expose sidewalls of the second sacrificial layers 108a.

The preliminary first sacrificial layer pattern 104a on the first region R1 does not include the first opening 106, and thus the first channel holes 128 extend through the preliminary first sacrificial layer pattern 104a and the second sacrificial layers 108a. As a result, the preliminary first sacrificial layer pattern 104a and the second sacrificial layers 108a are exposed by the first channel holes 128.

The first channel holes 128 and the second channel holes 130 may have different densities from each other (e.g., as viewed from a plan view). In example embodiments, the first channel holes 128 may have a first density (e.g., number of holes per unit area), and the second channel holes 130 may have a second density (e.g., number of holes per unit area) less than the first density. In example embodiments, each of the first and second channel holes 128 and 130 may have a width gradually decreasing from a top toward a bottom thereof.

Due the density difference between the first and second channel holes 128 and 130, a loading effect may occur in the etching process. Thus, the first and second channel holes 128 and 130 may have different shapes and/or sizes from each other.

In example embodiments, each of the first channel holes 128 has a first width, and each of the second channel holes 130 has a second width equal to or greater than the first width.

Bottoms of the first and second channel holes 128 and 130 may be coplanar with or lower than the upper surface of the substrate 100. The bottoms of the first and second channel holes 128 and 130 may be substantially coplanar with each other, or not. In example embodiments, the bottom of the first channel hole 128 may be substantially coplanar with or higher than the bottom of the second channel hole 130.

Figure 13:
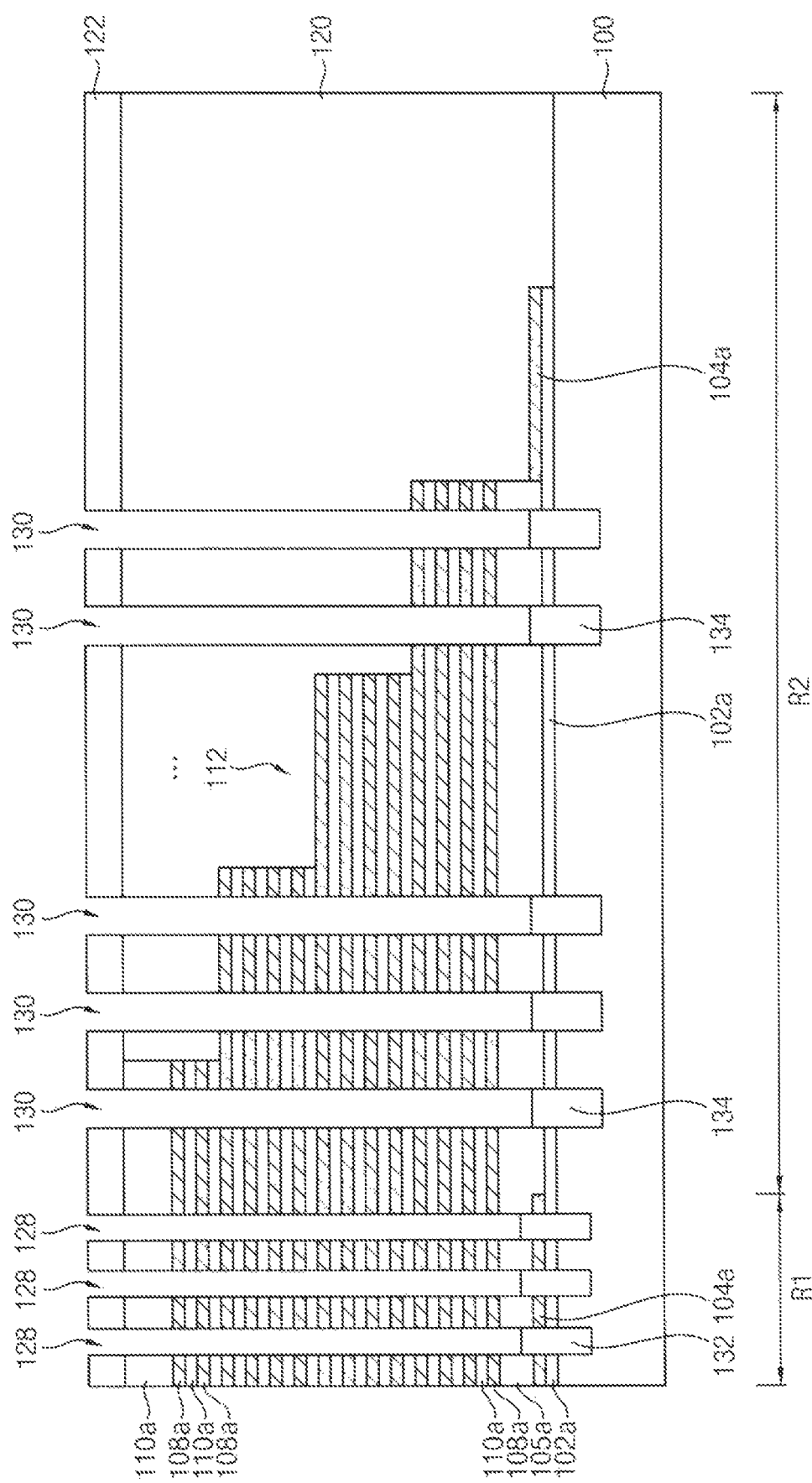

Referring to FIG. 13, a selective epitaxial growth (SEG) may be performed using the upper surfaces of the substrate 100 exposed by the first and second channel holes 128 and 130 as a seed. Thus, a first semiconductor pattern 132 may be formed in the first channel hole 128, and a second semiconductor pattern 134 may be formed in the second channel hole 130.

In example embodiments, the SEG process may be performed by providing a silicon source gas, an etching gas, and a carrier gas onto the substrate 100. The silicon source gas may include, e.g., silane gas, disilane gas, dichlorosilane gas, etc., the etching gas may include hydrogen chloride gas, and the carrier gas may include hydrogen gas. Thus, each of the first and second semiconductor patterns 132 and 134 may include single crystalline silicon.

The first semiconductor pattern 132 may serve as a channel region of a ground selection transistor (GST). Thus, an upper surface of the first semiconductor pattern 132 may be higher than an upper surface of the preliminary first sacrificial layer pattern 104a. The upper surface of the first semiconductor pattern 132 may be lower than a bottom of a lowermost one of the second sacrificial layers 108a.

An upper surface of the second semiconductor pattern 134 may be lower than the bottom of the lowermost one of the second sacrificial layers 108a. In one embodiment, the second semiconductor pattern 134 does not contact the preliminary first sacrificial layer pattern 104a.

Heights of the first and second semiconductor patterns 132 and 134 may vary according to widths of the first and second channel holes 128 and 130, and bottom locations of the first and second channel holes 128 and 130. In example embodiments, the upper surface of the second semiconductor pattern 134 may be substantially coplanar with or lower than the upper surface of the first semiconductor pattern 132.

For example, when the width of the second channel hole 130 is greater than that of the first channel hole 128, the upper surface of the second semiconductor pattern 134 may be lower than that of the first semiconductor pattern 132. When a bottom of the second channel hole 130 is lower than that of the first channel hole 128, the upper surface of the second semiconductor pattern 134 may be lower than that of the first semiconductor pattern 132.

As illustrated above, the preliminary first sacrificial layer pattern 104a may be replaced with the GSL. In this case, the upper surface of the second semiconductor pattern 134 does not contact the preliminary first sacrificial layer pattern 104a, and thus the second semiconductor pattern 134 and the GSL are not electrically connected to each other in a subsequent process. Thus, when the memory cells on the first region R1 are operated, no leakage current occurs due to the connection between the second semiconductor pattern 134 and the GSL, since the second semiconductor pattern 134 does not contact and is not electrically connected to the GSL. Accordingly, electrical failure can be avoided according to the location of the upper surface of the second semiconductor pattern 134. As discussed herein, an electrical connection refers to a connection between two components such that an electrical current or voltage can pass from one component to the other. Therefore, for a conductive component physically connected to (directly or indirectly) an insulative component where no current or voltage is passed, there is no electrical connection. Also, as discussed herein, "contact" refers to a direct physical connection (e.g., touching), with no intervening components disposed therebetween.

Figure 14:
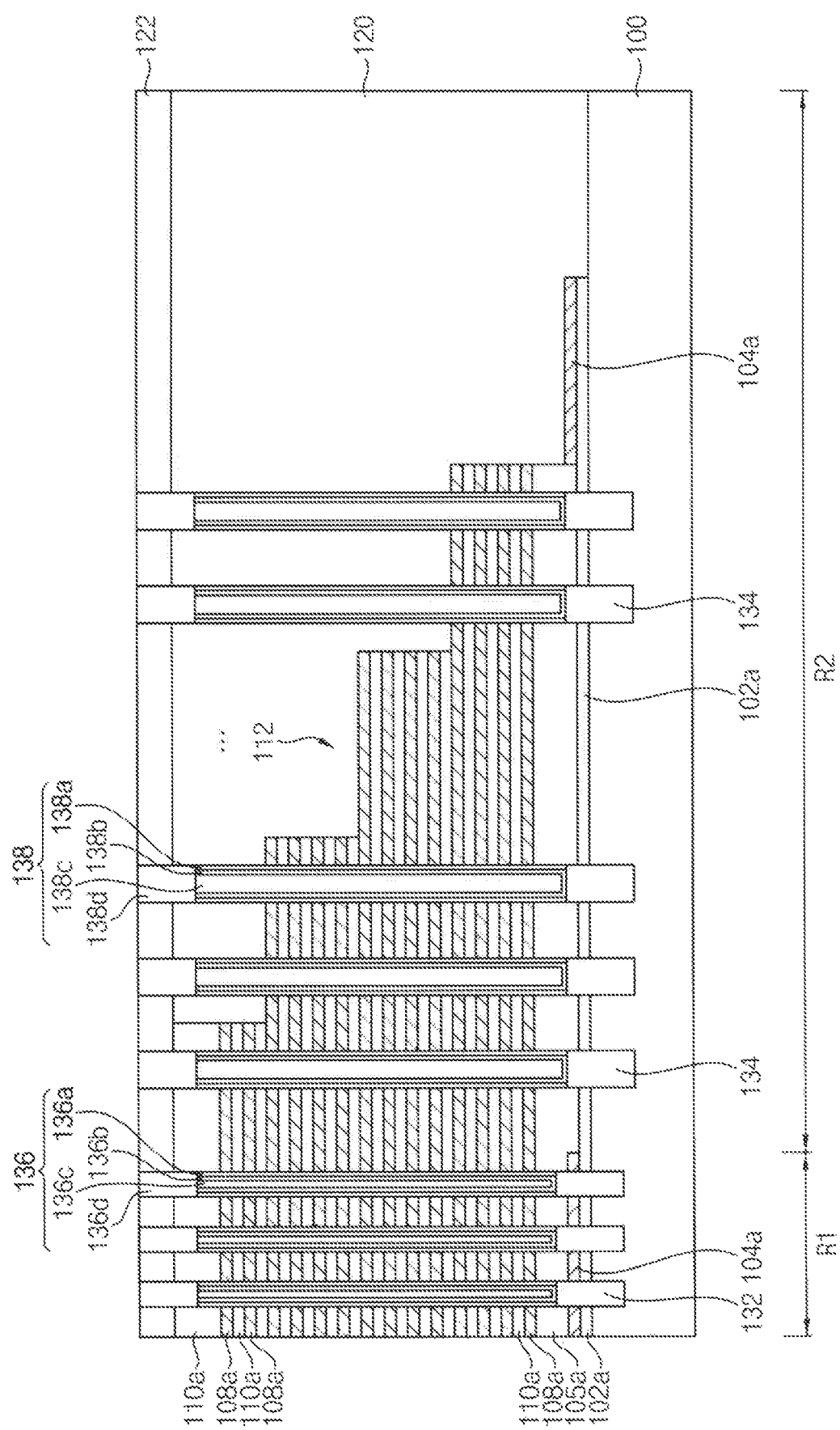

Referring to FIG. 14, a first channel structure 136 is formed on the first semiconductor pattern 132 to fill the first channel hole 128, and a second channel structure 138 is formed on the second semiconductor pattern 134 to fill the second channel hole 130.

The first channel structure 136 may include a first dielectric layer structure 136a, a first channel 136b, a first filling insulation pattern 136c, and a first pad pattern 136d. The second channel structure 138 may include a second dielectric layer structure 138a, a second channel 138b, a second filling insulation pattern 138c, and a second pad pattern 138d. The first and second channel structures 136 and 138 may be simultaneously formed by the same process, and thus may have substantially the same structure.

Each of the first and second dielectric layer structure 136a and 138a may include a tunnel insulation layer, a charge storage layer, and a blocking insulation layer. Each of the first and second channels 136b and 13b may include, e.g., polysilicon. Each of the first and second filling insulation patterns 136c and 138c may include, e.g., silicon oxide. Each of the first and second pad patterns 136d and 138d may include, e.g., polysilicon.

Figure 15:
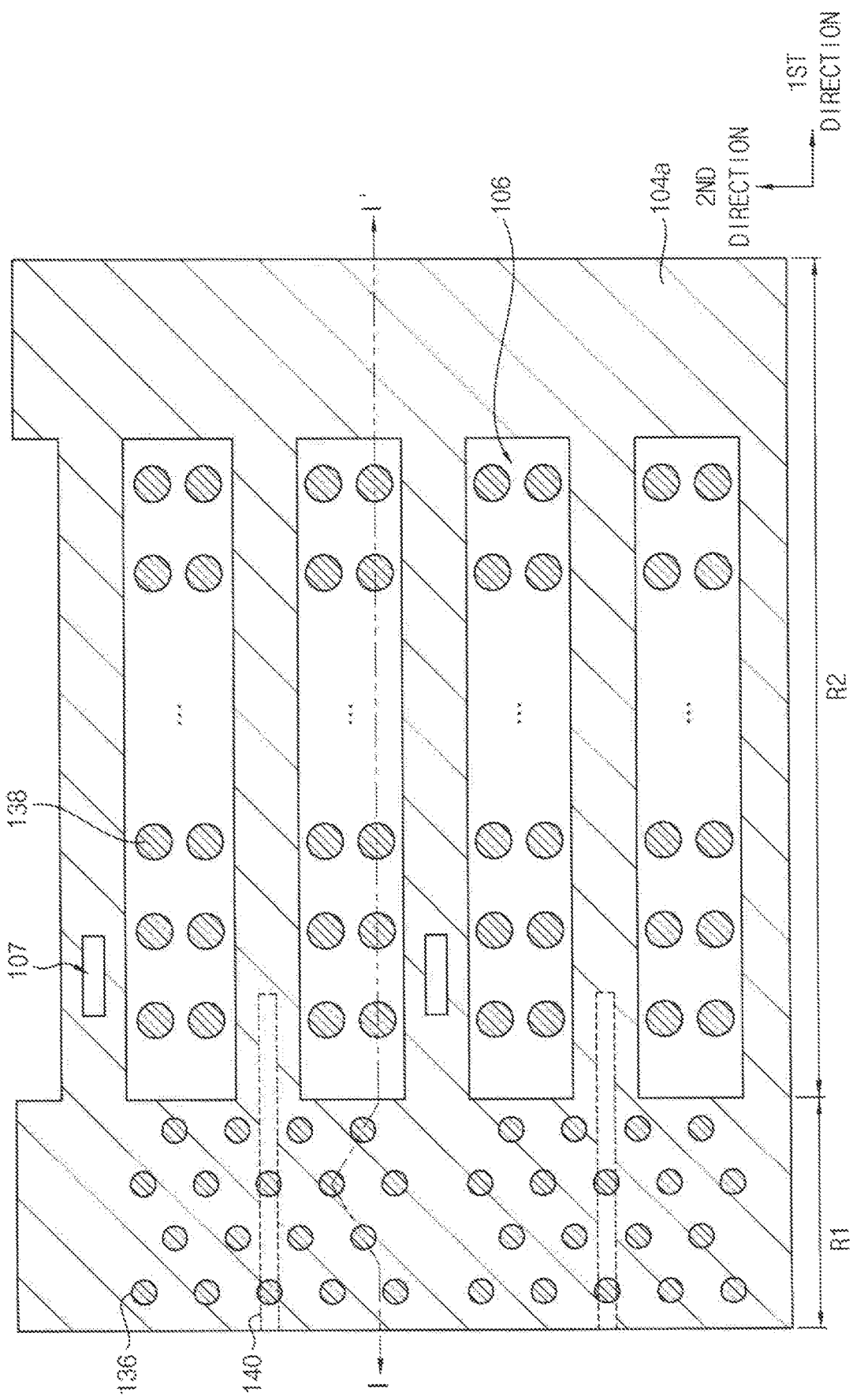

Referring to FIG. 15, a portion of the second sacrificial layer 108a is etched to form a second opening 140 (e.g., a plurality of second openings 140). In the etching process, portions of upper ones of the second sacrificial layers 108a may be cut so that the SSL may be formed in each string. For example, uppermost one or two of the second sacrificial layers 108a may be etched to form the second opening 140.

The second opening 140 may extend in the first direction from the first region R1 to a portion of the second region R2. The second opening 140 may be disposed at a central portion of each cell block in the second direction.

Figure 16:
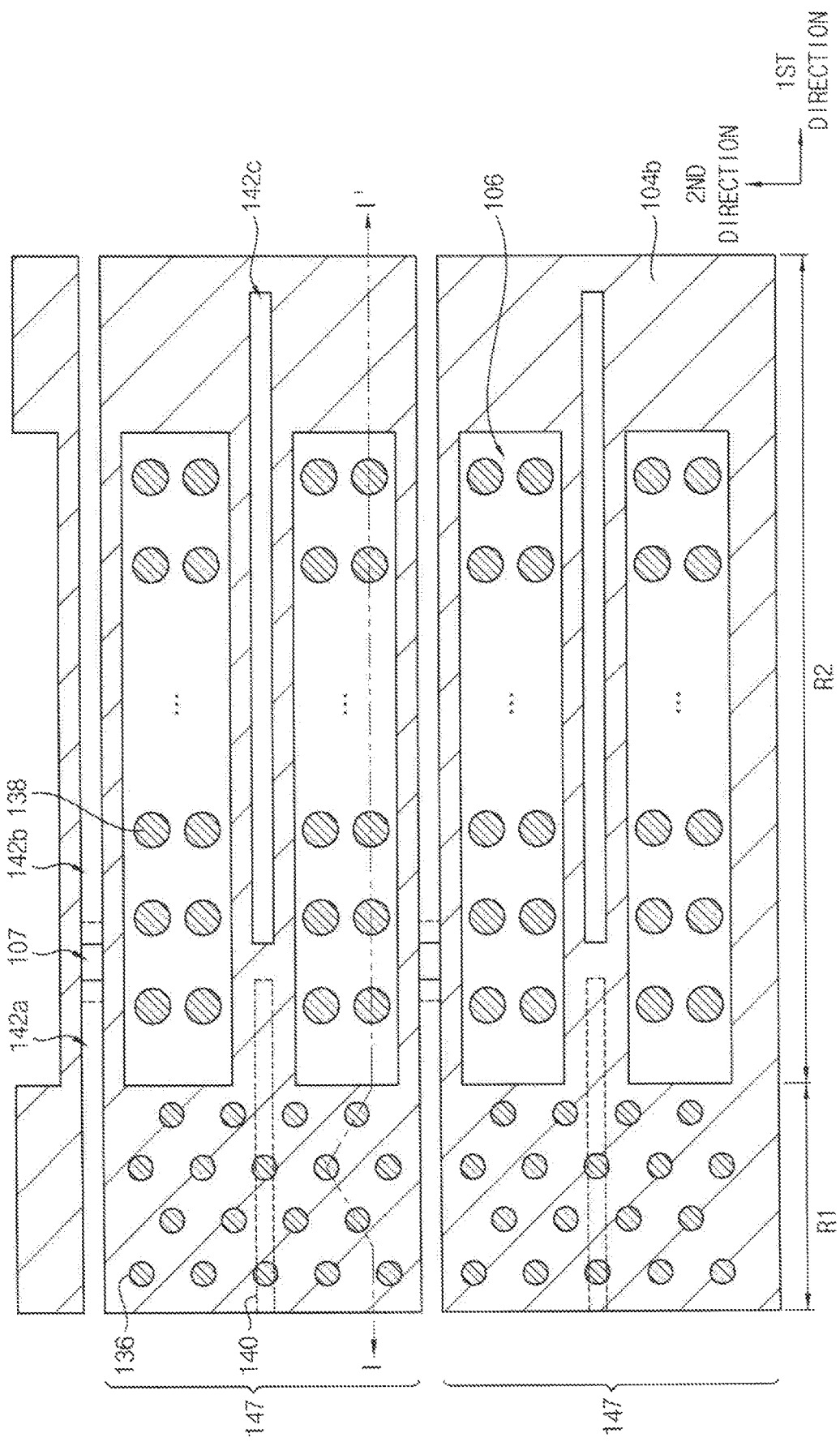
Figure 17:
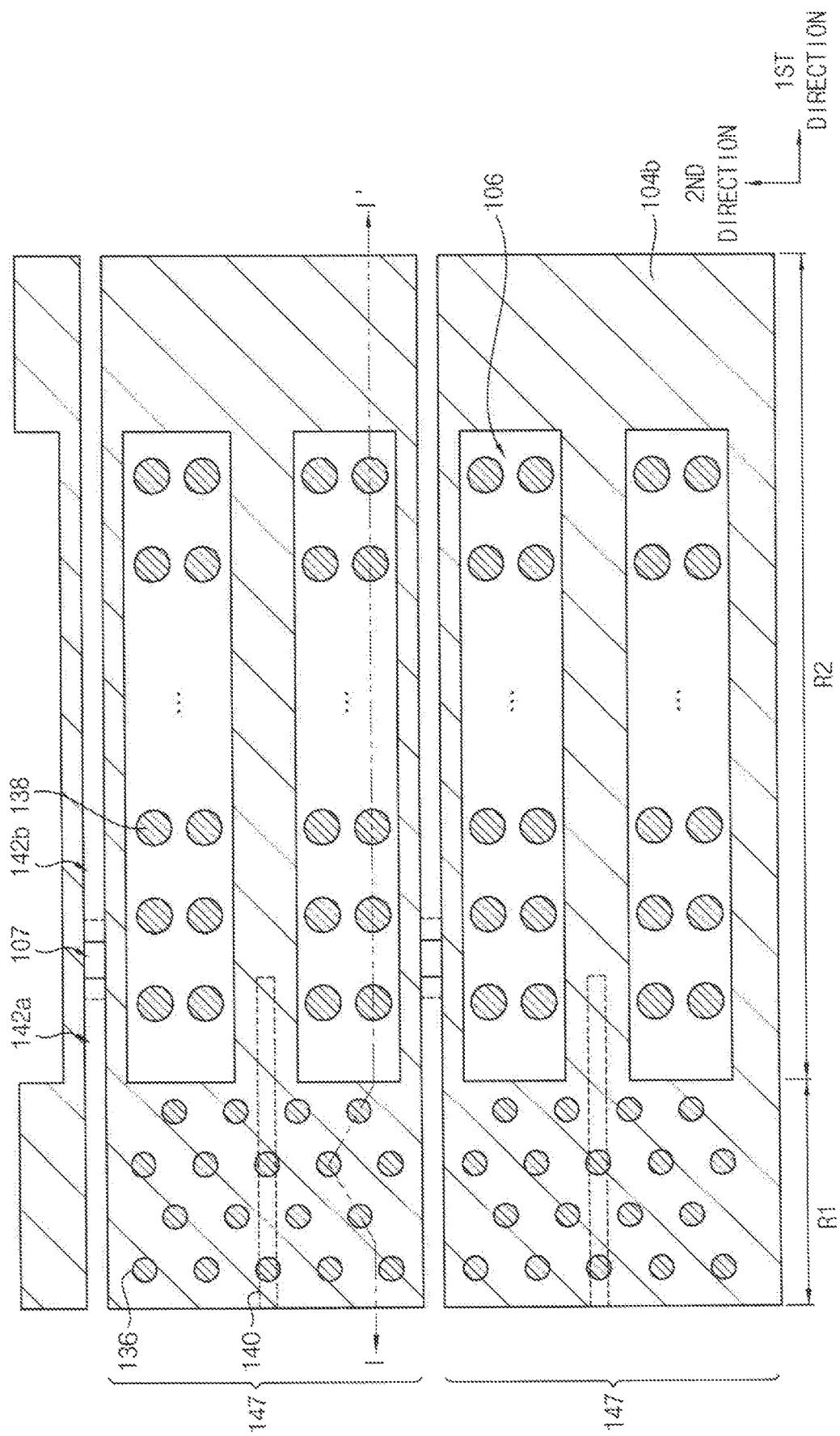

Referring to FIGS. 16 and 17, a word line cutting process in which the preliminary staircase-shaped mold structure 112 is etched is performed so that cell blocks are defined.

Thus, a third opening 142a and a fourth opening 142b each of which may extend in the first direction are formed. The third and fourth openings 142a and 142b may expose upper surfaces of the substrate 100. The third and fourth openings 142a and 142b may correspond to a word line cutting area.

The preliminary staircase-shaped mold structure 112 is transformed into a plurality of staircase-shaped mold structures spaced apart from each other by the etching process. Each of the staircase-shaped mold structures divided by the third and fourth openings 142a and 142b may serve as a cell block region 147. A portion of the preliminary first sacrificial layer pattern 104a may be etched to form a first sacrificial layer pattern 104b.

The third and fourth openings 142a and 142b may be spaced apart from each other in the first direction, and may be linearly arranged in the first direction. The first hole 107 may be disposed between the third and fourth openings 142a and 142b in a plan view.

In example embodiments, the third opening 142a may extend in the first direction on the first region R1 and a portion of the second region R2. An end of the third opening 142a on the second region R2 may be disposed in the first hole 107 of the preliminary first sacrificial layer pattern 104a. Thus, the end of the third opening 142a may overlap an end of the first hole 107.

In example embodiments, the fourth opening 142b may be spaced apart from the third opening 142a in the first direction, and may be disposed on a portion of the preliminary staircase-shaped mold structure 112 on the second region R2. An end of the fourth opening 142b may be disposed in the first hole 107 of the preliminary first sacrificial layer pattern 104a. Thus, the end of the fourth opening 142b may overlap an end of the first hole 107. Thus, the third opening 142a, first hole 107, and fourth opening 142b together form a continuous opening in the first sacrificial layer pattern 104b to separate different cell block regions 147. The continuous opening may be referred to as a cell block separating opening, or gate separation opening.

In example embodiments, the fourth opening 142b may extend to an end of the preliminary staircase-shaped mold structure 112 in the first direction.

The first hole 107 and the third and fourth openings 142a and 142b in the first sacrificial layer pattern 104b may be connected with one another to extend in the first direction, as mentioned above. Thus, the first sacrificial layer pattern 104b may be divided into a plurality of pieces. However, the first holes 107 are not formed in the second sacrificial layers 108a, and thus the second sacrificial layers 108a are not cut but remain connected with each other at the third and fourth openings 142a and 142b.

In example embodiments, as shown in FIG. 16, in the etching process, a portion of the preliminary staircase-shaped mold structure 112 may be etched from a top to a bottom thereof to form a fifth opening 142c. The fifth opening 142c may be spaced apart from the second opening 140 in the first direction and may extend in the first direction. The fifth opening 142c may be disposed in a portion of the preliminary staircase-shaped mold structure 112 on the second region R2. The fifth opening 142c may expose an upper surface of the substrate 100. The fifth opening 142c may correspond to a dummy cutting area for removing a portion of the preliminary staircase-shaped mold structure 112 on the second region R2. The fifth opening 142c and the second opening 140 may be spaced apart from each other, and thus the first sacrificial layer pattern 104b is not divided but remains connected at an area between the fifth and second openings 142c and 140, and the second sacrificial layer 108a is not be divided but remains connected at the area between the fifth and second openings 142c and 140. In one embodiment, the fifth opening 142c do not extend to the end of the preliminary staircase-shaped mold structure 112 in the first direction. Thus, ends of the neighboring first sacrificial layer patterns 104b in the first direction remain connected with each other.

In some embodiments, as shown in FIG. 17, no fifth opening 142c are formed.

Figure 18:
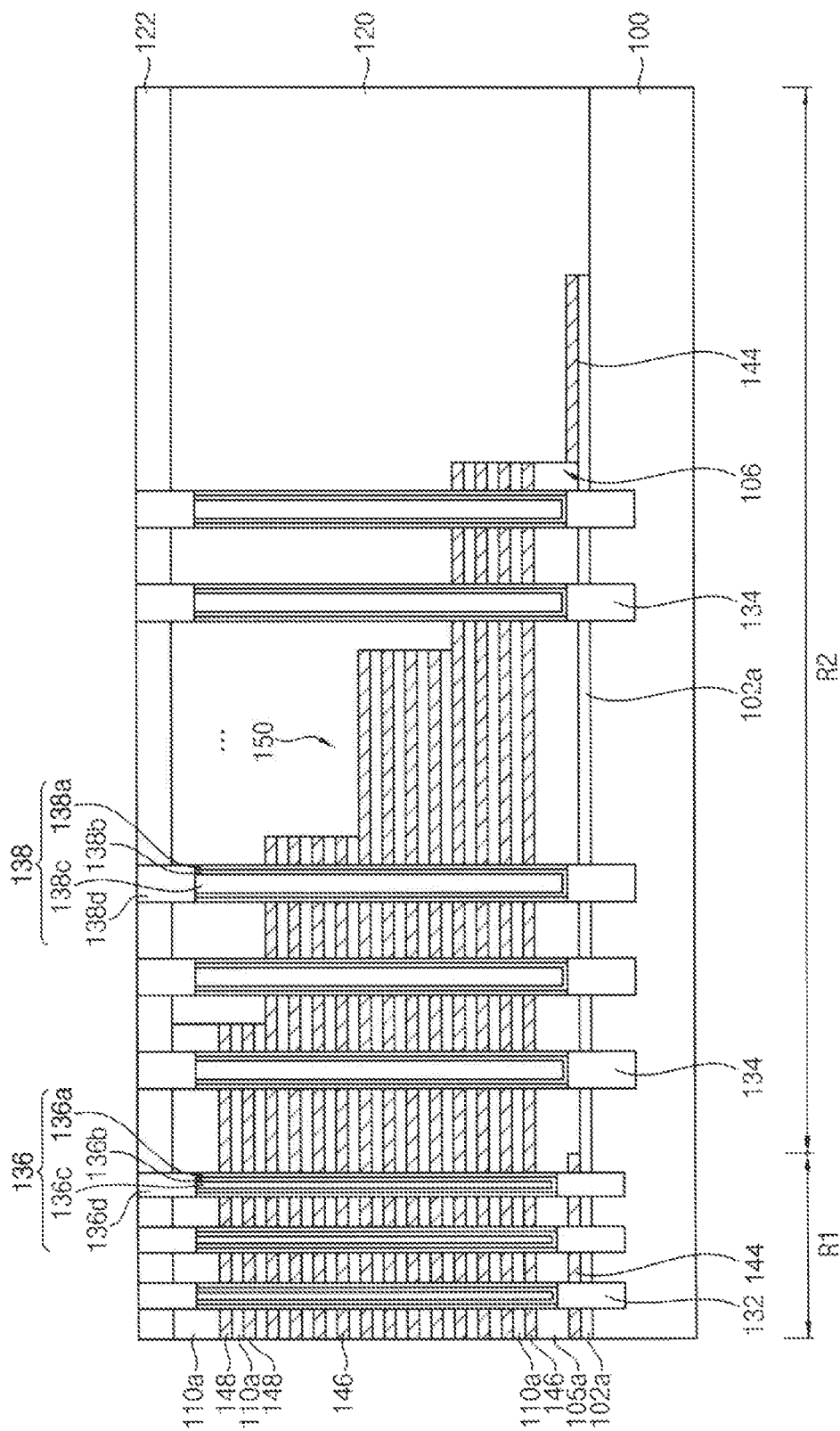

Referring to FIG. 18, the first sacrificial layer pattern 104b and the second sacrificial layer 108a exposed by the first to fifth openings 106, 140, 142a, 142b and 142c and the first hole 107 are removed. In example embodiments, the first sacrificial layer pattern 104b and the second sacrificial layer 108a may be removed by an isotropic etching process.

As the first sacrificial layer pattern 104b and the second sacrificial layer 108a are removed, gaps are formed between the insulation layers 102a, 105a and 110a. A conductive material is filled into the gaps to form gate patterns 144, 146 and 148. As such, the first sacrificial layer patterns 104b and the second sacrificial layers 108a are replaced with the gate patterns 144, 146 and 148. In example embodiments, the gate patterns 144, 146 and 148 include a metal or a metal nitride.

By the above process, a conductive pattern structure 150 including the insulation layers 102a, 105a and 110a and the gate patterns 144, 146 and 148 alternately stacked is formed.

As illustrated above, a lowermost one of the gate patterns 144, 146 and 148, i.e., the gate pattern 144 may serve as a GSL, uppermost two of the gate patterns 144, 146 and 148, i.e., the gate pattern 148 may serve as SSLs, respectively, and other ones of the gate patterns 144, 146 and 148, i.e., the gate patterns 146 may serve as word lines, respectively.

In example embodiments, as shown in FIG. 2, the GSL 144 of each cell block on the second region R2 includes two first openings 106 each of which extends in the first direction. In example embodiments, the first opening 106 is disposed between the fourth opening 142b and the fifth opening 142c in a plan view. The second channel structures 138 are formed within the area of the first opening 106 in a plan view.

In some embodiments, as shown in FIG. 3, the GSL 144 may include two first openings 106 between the fourth openings 142b defining the cell block. No fifth openings 142c may be formed between the first openings 106.

A portion of the GSL 144 on the second region R2 may be connected to a portion of the GSL 144 on the first region R1 through a linear portion extending in the first direction at each of opposite sides of the first opening 106 in the second direction. However, the GSL 144 and the second semiconductor pattern 134 do not contact each other, and thus no operation failure occurs according to the location of the second semiconductor pattern 134. Thus, the second semiconductor pattern 134 passes through GSL 144 via the first opening 106, but does not contact or communicate with the GSL 144 since it is separated by an insulator. Consequently, in one embodiment, the second channel structures 138 connected to the second semiconductor patterns 134 serve as dummy channel structures, since they do not communicate with or receive signals from the GSL 144 and therefore do not operate. In one embodiment, the second semiconductor patterns 134 and second channel structures 138 serve as structural supports that are not used for electrical signaling.

Figure 19:
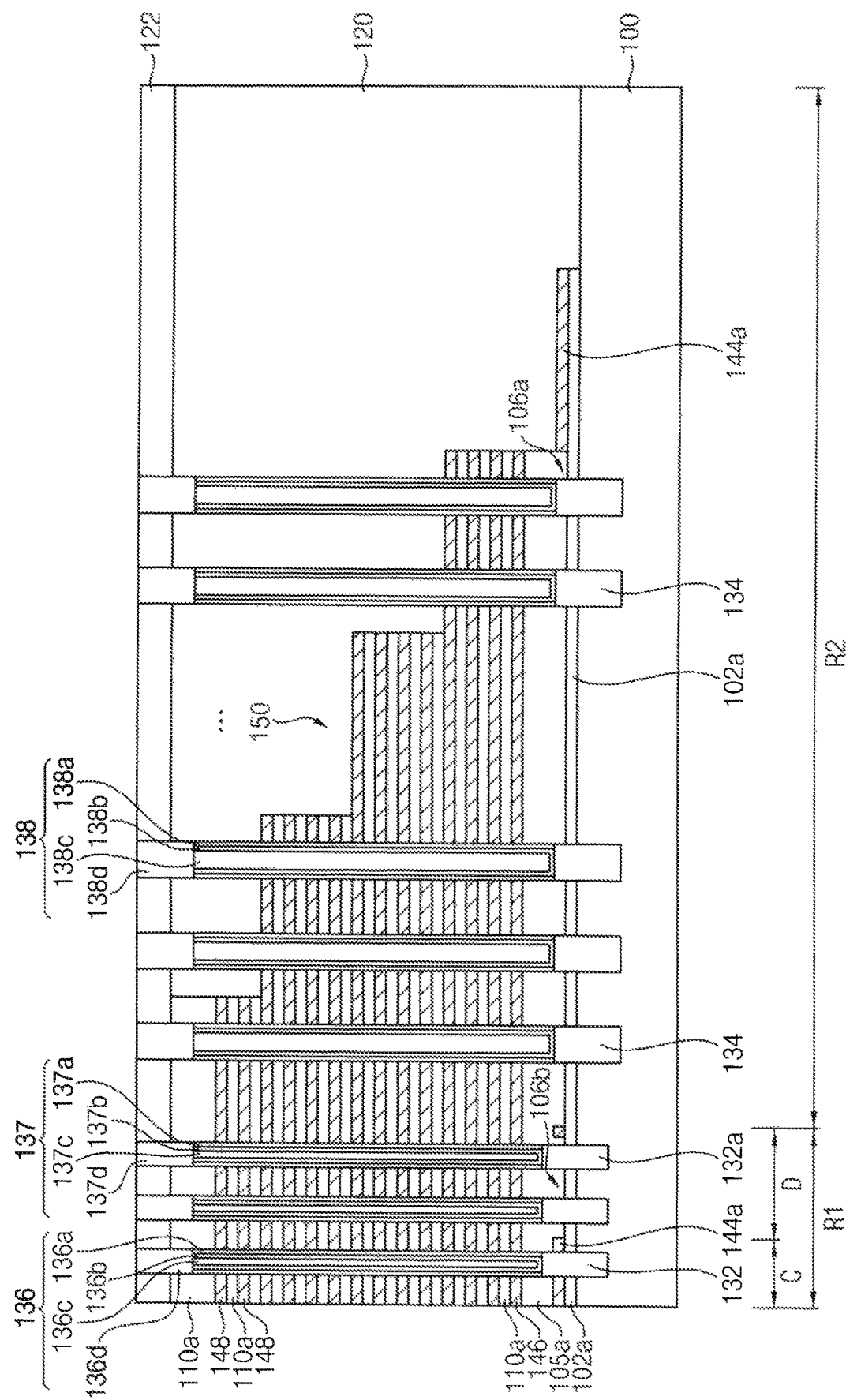
FIGS. 19 and 20 are a cross-sectional view and a plan view, respectively, illustrating a vertical semiconductor device in accordance with example embodiments.
Figure 20:
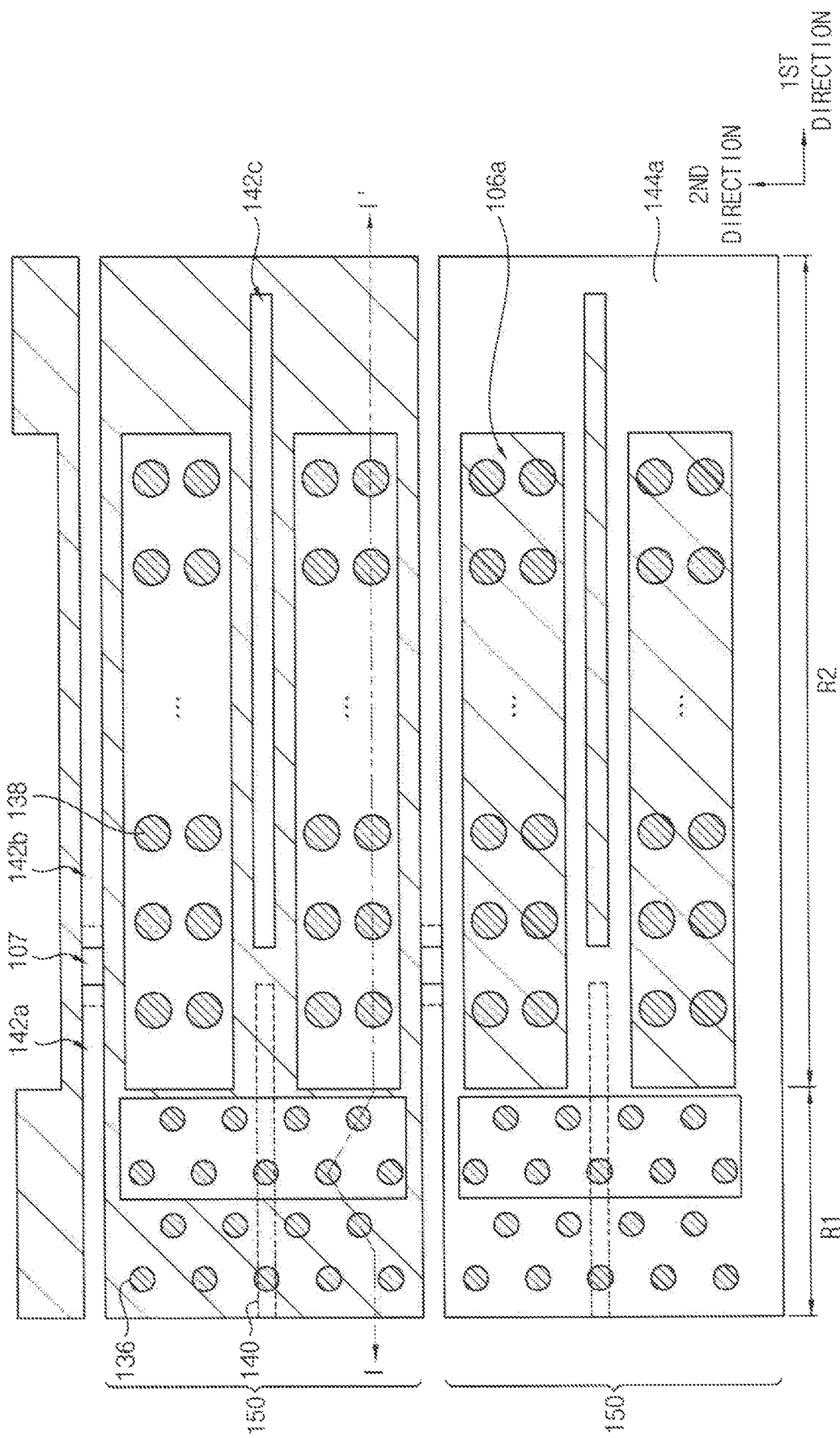
Figure 21:
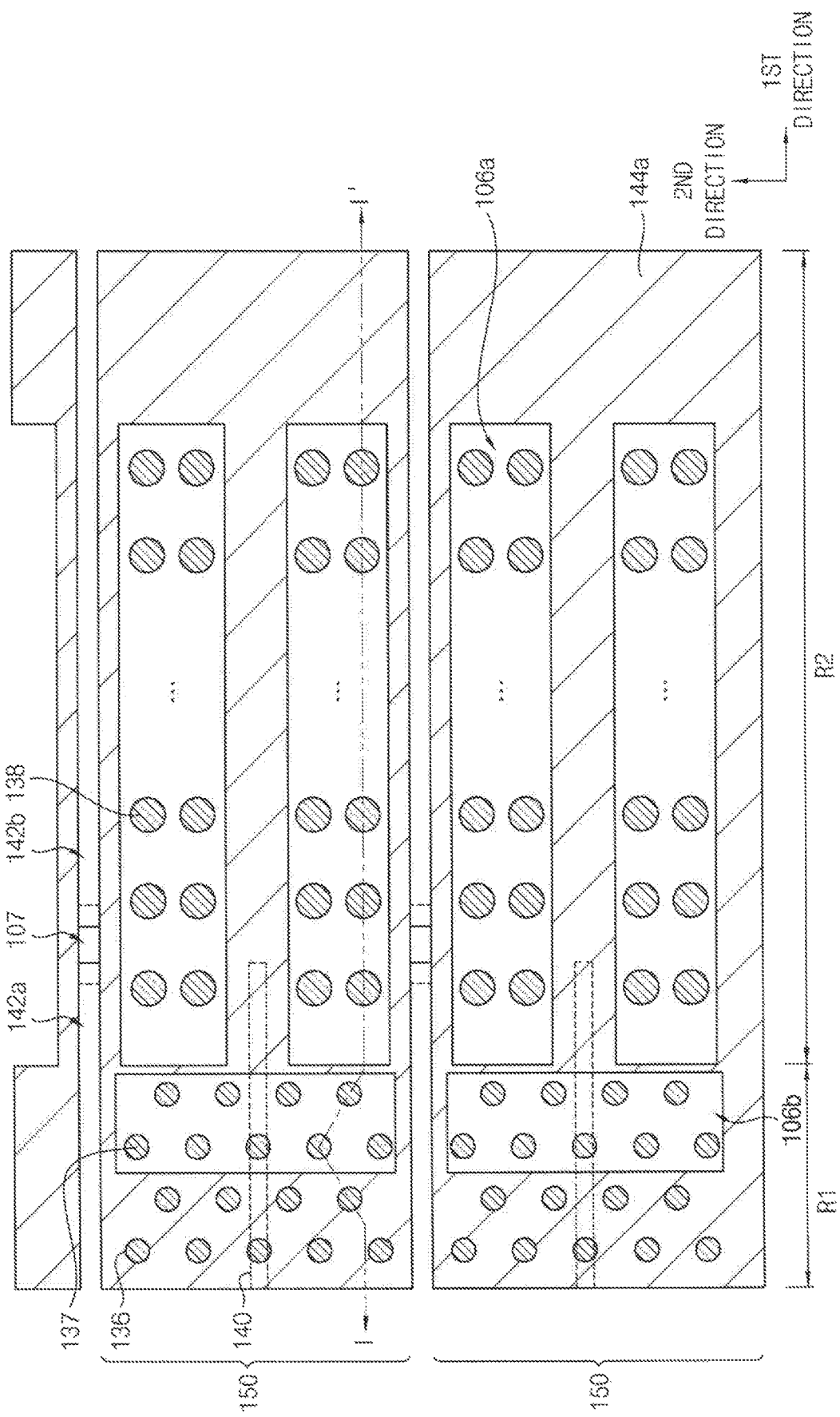
FIG. 21 is a plan view illustrating a vertical semiconductor device in accordance with example embodiments.

FIGS. 19 and 20 are a cross-sectional view and a plan view, respectively, illustrating a vertical semiconductor device in accordance with example embodiments. FIG. 21 is a plan view illustrating a vertical semiconductor device in accordance with example embodiments.

The vertical semiconductor device of FIGS. 19 and 20 are substantially the same as that of FIGS. 1 and 2, except for the shape of the GSL. Thus, the GSL will be mainly illustrated hereinafter.

Referring to FIGS. 19 and 20, the substrate 100 may include the first and second regions R1 and R2. The first region R1 may include a cell region C for memory cells and a dummy cell region D for dummy cells. The dummy cell region D may be disposed at an edge of the first region R1. For example, cells on the edge of the first region R1, i.e., on the dummy cell region D2 may be dummy cells that are not actually operated. The second region R2 may be for wirings electrically connected to the memory cells. The second region R2 may surround the first region R1 and contact the edge of the first region R1.

The conductive pattern structure 150 may be formed on the substrate 100. The conductive pattern structure 150 may be substantially the same as that of FIGS. 1 and 2, except for a GSL 144a. The conductive pattern structure 150 may include the first to fifth openings 106a, 140, 142a, 142b and 142c.

The GSL 144a on the dummy cell region D of the first region R1 may include a sixth opening 106b. The sixth opening 106b may be filled with an insulation layer.

The first channel structure 136 may extend through the conductive pattern structure 150 on the cell region C of the first region R1. A dummy channel structure 137 may extend through the conductive pattern structure 150 on the dummy cell region D of the first region R1. The second channel structure 138 may extend through the conductive pattern structure 150 on the second region R2.

The first dummy channel structure 137 may include a first dummy dielectric layer structure 137a, a first dummy channel 137b, a first dummy filling insulation pattern 137c, and a first dummy pad pattern 137d. A semiconductor pattern 132a may be formed under the dummy channel structure 137.

The dummy channel structure 137 may be disposed with in an area of the sixth opening 106b in a plan view, and may thus have an area smaller than the area of the sixth opening 106b. Thus, the dummy channel structure 137 does not contact the GSL 144a or communicate with the GSL 144a. The semiconductor pattern 132a under the dummy channel structure 137 also does not contact the GSL 144a and does not communicate with the GSL 144a, even though it passes through the GSL 144a via the sixth opening 106b. A sidewall of the semiconductor pattern 132a may contact the lowermost insulation layer 102a.

Accordingly, when the memory cells on the first region R1 are operated, no leakage current occurs due to a connection between the semiconductor pattern 132a and the GSL 144a, since there is no such connection.

The GSL 144a on the second region R2 may be substantially the same as that of FIG. 1. That is, the GSL 144a on the second region R2 may include two first openings 106a each of which may extend in the first direction. The GSL 144a of each conductive pattern structure 150 on the second region R2 may include the first hole 107 between the third and fourth openings 142a and 142b in a plan view.

In some embodiments, as shown in FIG. 21, the conductive pattern structure 150 does not include the fifth opening 142c.

Figure 22:
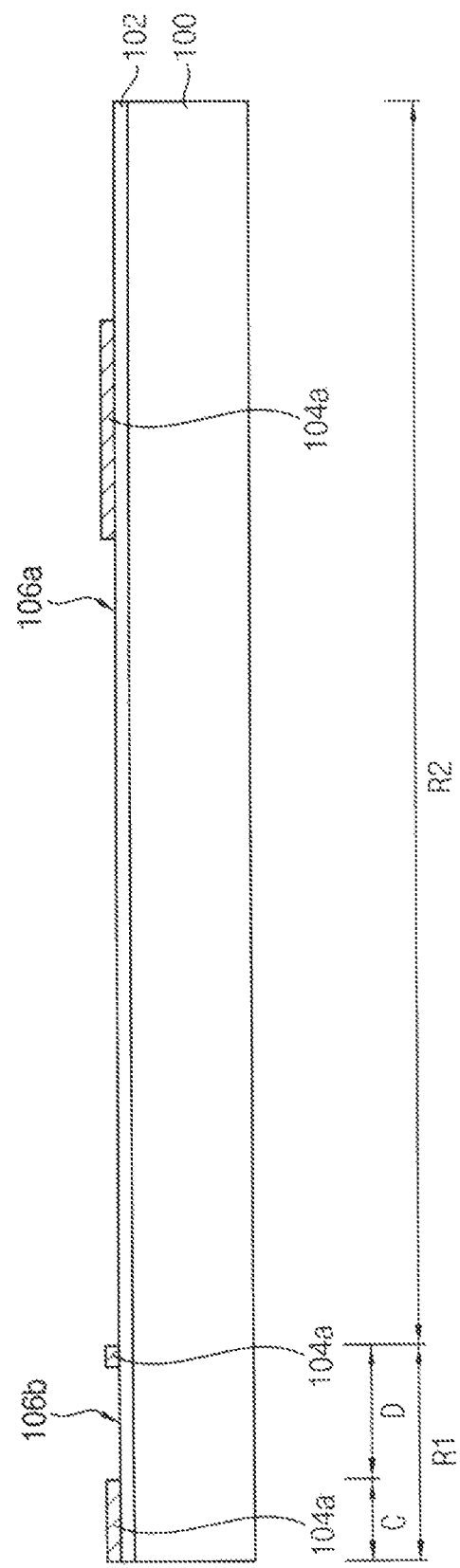
FIGS. 22 to 24 are a cross-sectional view and plan views illustrating a method of manufacturing a vertical semiconductor device in accordance with example embodiments.
Figure 23:
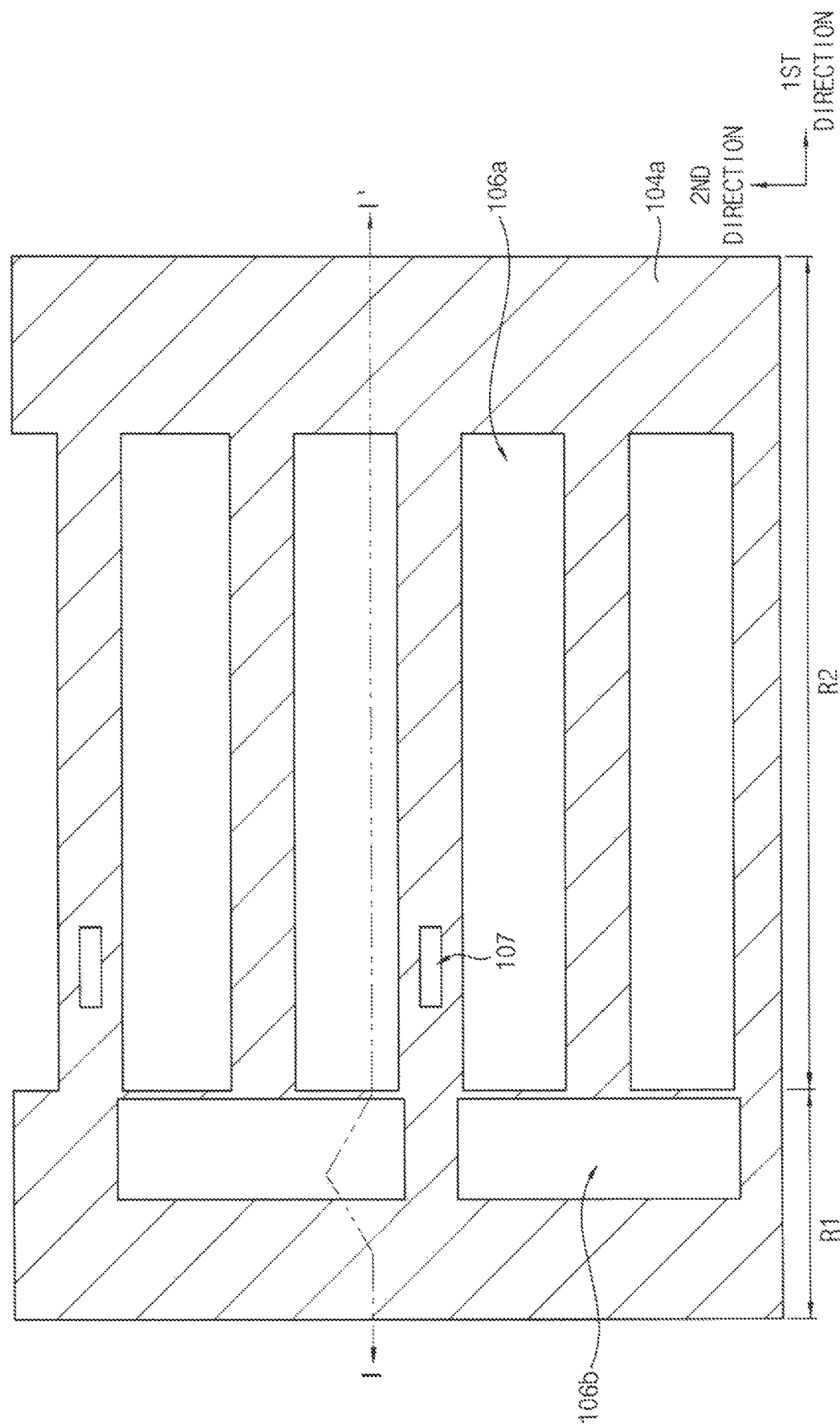
Figure 24:
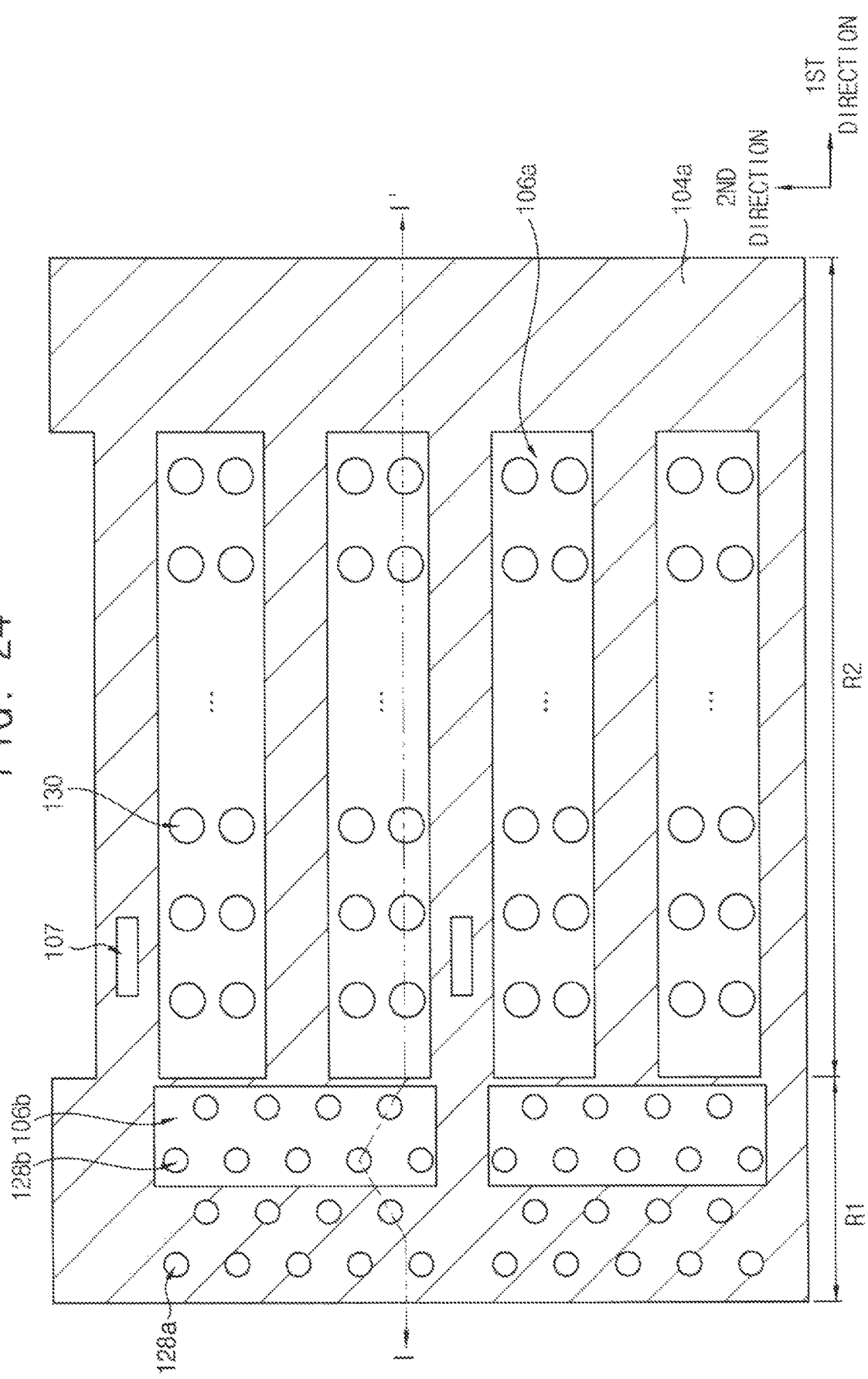

FIGS. 22 to 24 are a cross-sectional view and plan views illustrating a method of manufacturing a vertical semiconductor device in accordance with example embodiments.

Referring to FIGS. 22 and 23, the preliminary first lower insulation layer 102 and the first sacrificial layer 104 may be formed on the substrate 100 including the first and second regions R1 and R2. An etching mask may be formed on the first sacrificial layer 104, and the first sacrificial layer 104 may be patterned using the etching mask to form the preliminary first sacrificial layer pattern 104a.

In the etching process, a portion of the first sacrificial layer 104 on the dummy cell region D of the first region R1 may be removed to form a sixth opening 106b. The first hole 107 and the first opening 106a may be formed in a portion of the first sacrificial layer 104 on the second region R2. A portion of the first sacrificial layer 104 on the cell region C of the first region R1 is not removed.

Processes substantially the same as or similar to those illustrated with reference to FIGS. 7 to 10 may be performed. Thus, the preliminary staircase-shaped mold structure 112 and the first and second insulating interlayers 120 and 122 are formed.

Referring to FIG. 24, the preliminary staircase-shaped mold structure 112, the first and second insulating interlayers 120 and 122 may be anisotropically etched to form a first channel hole 128a, a first dummy channel hole 128b, and the second channel holes 130.

The first channel hole 128a may be formed on the cell region C of the first region R1, and the first dummy channel hole 128b may be formed on the dummy cell region D of the first region R1. The second channel holes 130 may be formed on the second region R2.

As shown in the figures, the first dummy channel hole 128b may be formed within an area of the sixth opening 106b of the preliminary first sacrificial layer pattern 104a in a plan view. The second channel holes 130 may be formed within an area of the first opening 106a of the preliminary first sacrificial layer pattern 104a in a plan view. For example, the first dummy channel hole 128b and the second channel holes 130 may not extend through the preliminary first sacrificial layer pattern 104a. Accordingly, the preliminary first sacrificial layer pattern 104a is not exposed by the first dummy channel hole 128b and the second channel holes 130.

Processes substantially the same as or similar to those illustrated with reference to FIGS. 14 to 18 may be performed to manufacture the vertical semiconductor device of FIG. 20 or FIG. 21.

In the vertical semiconductor device according to certain embodiments, the GSL does not contact or communicate with the second channel structures or the semiconductor pattern under the first dummy channel structures, and thus leakage current due to the GSL and the semiconductor pattern may be reduced.

While example embodiments have been particularly shown and described, it will be understood by one of ordinary skill in the art that variations in form and detail may be made therein without departing from the spirit and scope of the claims.

What is claimed is:

1. A vertical semiconductor device, comprising:
   a first gate pattern extending in a first direction on a substrate including first and second regions, the first direction parallel to an upper surface of the substrate, and a portion of the first gate pattern on the second region including a first opening;
   second gate patterns vertically stacked and spaced apart from each other on the first gate pattern to form a staircase shape in the second region, each of the second gate patterns extending in the first direction, wherein the first opening is formed in the second region where the staircase shape is formed;
   a first channel hole extending through the second gate patterns and the first gate pattern and exposing a first portion of the substrate on the first region of the substrate;
   a first semiconductor pattern at a lower portion of the first channel hole;
   a second channel hole extending through the second gate patterns and exposing a second portion of the substrate on the second region of the substrate, the second channel hole being disposed within an area of the first opening in a plan view, wherein the first opening has a larger area than the second channel hole in a plan view; and
   a second semiconductor pattern at a lower portion of the second channel hole,
   wherein the second channel hole passes through the first opening at a location under a lowermost second gate pattern of the second gate patterns.

2. The vertical semiconductor device of claim 1, wherein a sidewall of the first semiconductor pattern contacts the first gate pattern.

3. The vertical semiconductor device of claim 1, further comprising insulation layers, disposed between the first gate pattern and the second gate patterns and between each of the second gate patterns,
   wherein a sidewall of the second semiconductor pattern contacts an insulation layer, from among the insulation layers, that is under a lowermost one of the second gate patterns.

4. The vertical semiconductor device of claim 1, further comprising:
   a first channel structure on the first semiconductor pattern in the first channel hole; and
   a second channel structure on the second semiconductor pattern in the second channel hole.

5. The vertical semiconductor device of claim 1, wherein the first region of the substrate includes a cell region and a dummy cell region, and
   wherein a portion of the first gate pattern is on the dummy cell region and includes a second opening.

6. The vertical semiconductor device of claim 5, further comprising a third semiconductor pattern at a lower portion of a dummy channel hole extending through the second gate patterns and the first gate pattern and exposing an upper surface of a portion of the substrate in the dummy cell region of the substrate, the dummy channel hole being within an area of the second opening in a plan view and having an area smaller than the area of the second opening.

7. The vertical semiconductor device of claim 6, further comprising insulation layers, disposed between the first gate pattern and the second gate patterns and between each of the second gate patterns,
   wherein a sidewall of the third semiconductor pattern contacts an insulation layer, from among the insulation layers, that is under a lowermost one of the second gate patterns.

8. The vertical semiconductor device of claim 1, wherein the first gate pattern includes two first openings each extending in the first direction.

9. The vertical semiconductor device of claim 8, further comprising a third opening extending in the first direction through the first gate pattern and the second gate patterns, the third opening being between the two first openings.

10. The vertical semiconductor device of claim 1, wherein an upper surface of the second semiconductor pattern is coplanar with or lower than that of the first semiconductor pattern.

11. The vertical semiconductor device of claim 1, wherein the first gate pattern is a ground select line, and the first semiconductor pattern passes through the first gate pattern but does not communicate with the first gate pattern.

12. The vertical semiconductor device of claim 1, wherein the first opening does not divide the first gate pattern, and a portion of the first gate pattern is formed around an end of the first opening in the first direction.

13. A vertical semiconductor device, comprising:
a conductive pattern structure including a first gate pattern and second gate patterns on each of first and second regions of a substrate, the first gate pattern and second gate patterns being sequentially stacked in a vertical direction perpendicular to an upper surface of the substrate;
a first channel hole extending through the second gate patterns and the first gate pattern and exposing a first portion of the substrate on the first region of the substrate;
a first semiconductor pattern at a lower portion of the first channel hole, the first semiconductor pattern contacting the first gate pattern;
a second channel hole extending through the second gate patterns and exposing a second portion of the substrate on the second region of the substrate; and
a second semiconductor pattern at a lower portion of the second channel hole, the second semiconductor pattern not contacting the first gate pattern.

14. The vertical semiconductor device of claim 13, wherein the first gate pattern includes a first opening on the second region of the substrate, and
wherein the second semiconductor pattern is within an area of the first opening in a plan view and has an area smaller than the area of the first opening in a plan view.

15. The vertical semiconductor device of claim 13, wherein a sidewall of the conductive pattern structure on the second region of the substrate is part of a staircase shape.

16. The vertical semiconductor device of claim 13, wherein the first region of the substrate includes a cell region and a dummy cell region, the first gate pattern is disposed on the dummy cell region, and the first gate pattern on the dummy cell region includes a second opening.

17. The vertical semiconductor device of claim 16, further comprising a third semiconductor pattern at a lower portion of a dummy channel hole extending through the second gate patterns and the first gate pattern and exposing an upper surface of the substrate on the dummy cell region of the substrate, the dummy channel hole being within an area of the second opening and having an area smaller than the area of the second opening in a plan view.

18. A vertical semiconductor device, comprising:
a first gate pattern extending in a first direction on a substrate including first and second regions, the first direction parallel to an upper surface of the substrate, and a portion of the first gate pattern on the first region including a first opening;
second gate patterns vertically stacked and spaced apart from each other on the first gate pattern, each of the second gate patterns extending in the first direction;
a first vertical structure, including a first semiconductor pattern, extending through the second gate patterns and the first gate pattern and contacting a first portion of the substrate on the first region of the substrate, the first semiconductor pattern contacting the first gate pattern; and
a second vertical structure, including a second semiconductor pattern, extending through the second gate patterns and the first gate pattern, and contacting a portion of the substrate on the second region of the substrate, the second semiconductor pattern not contacting the first gate pattern.

19. The vertical semiconductor device of claim 18, wherein the second vertical structure is disposed within an area of the first opening in a plan view.

20. The vertical semiconductor device of claim 18, further comprising insulation layers between the first gate pattern and the second gate patterns and between each of the second gate patterns,
wherein a sidewall of the second semiconductor pattern contacts an insulation layer from among the insulation layers, that is under a lowermost one of the second gate patterns.

* * * * *